United States Patent
Miyamoto

(10) Patent No.: US 9,501,451 B2
(45) Date of Patent: Nov. 22, 2016

(54) LINEAR SYSTEM COEFFICIENT ESTIMATING METHOD, LINEAR DEVICE COLUMN VALUE ESTIMATING METHOD, CAPACITANCE DETECTING METHOD, INTEGRATED CIRCUIT, TOUCH SENSOR SYSTEM, AND ELECTRONIC DEVICE

(75) Inventor: Masayuki Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 707 days.

(21) Appl. No.: 13/879,819

(22) PCT Filed: Jun. 29, 2011

(86) PCT No.: PCT/JP2011/065419
§ 371 (c)(1),
(2), (4) Date: Apr. 17, 2013

(87) PCT Pub. No.: WO2012/063520
PCT Pub. Date: May 18, 2012

(65) Prior Publication Data
US 2013/0211757 A1 Aug. 15, 2013

(30) Foreign Application Priority Data

Nov. 12, 2010 (JP) .................................. 2010-253879
Feb. 3, 2011 (JP) .................................. 2011-022022

(51) Int. Cl.
*G01R 25/00* (2006.01)
*G01R 15/00* (2006.01)
(Continued)

(52) U.S. Cl.
CPC ............... *G06F 17/16* (2013.01); *G06F 3/044* (2013.01); *G06F 3/0416* (2013.01); *G06F 17/12* (2013.01)

(58) Field of Classification Search
CPC ................... G06F 3/044; G06F 3/0416; G06F 3/0418; G06F 3/0383
(Continued)

(56) References Cited

U.S. PATENT DOCUMENTS

| 5,905,489 A | 5/1999 | Takahama et al. |
| 6,452,514 B1 | 9/2002 | Philipp |

(Continued)

FOREIGN PATENT DOCUMENTS

| CN | 101751193 A | 6/2010 |
| JP | 9-44293 A | 2/1997 |

(Continued)

OTHER PUBLICATIONS

International Search Report issued in PCT/JP2011/065419, mailed on Aug. 9, 2011.
(Continued)

*Primary Examiner* — An Do
(74) *Attorney, Agent, or Firm* — Birch, Stewart, Kolasch & Birch, LLP

(57) ABSTRACT

A capacitance detecting method disclosed herein, which achieves a good detection accuracy, a good resolution, and a high-speed operation, (A)(a) drives, on the basis of code sequences (di (=di1, . . . , diN, where i=1, . . . , M)) which are orthogonal to one another, drive lines (DL1, . . . , DLM) in parallel for each of (I) a first capacitance column (Ci1) between the drive lines and a first sense line (SL1) and (II) a second capacitance column (Ci2) between the drive lines and a second sense line (SL2) and (b) outputs (sFirst= (s11, . . . , s1N)) from the column (Ci1) and outputs (sSecond=(s21, . . . , s2N)) from the column (Ci2), and (B) estimates (a) on the basis of inner product operation of the outputs (sFirst) and the code sequences (di), a first capacitance value in the column (Ci1) and (b) on the basis of inner (Continued)

product operation of the outputs (sSecond) and the code sequences (di), a second capacitance value in the column (Ci2).

12 Claims, 15 Drawing Sheets

(51) Int. Cl.
  *G01R 19/00* (2006.01)
  *G06F 17/16* (2006.01)
  *G06F 3/041* (2006.01)
  *G06F 3/044* (2006.01)
  *G06F 17/12* (2006.01)

(58) Field of Classification Search
  USPC ............... 702/57, 64, 65; 324/686; 345/174; 708/400
  See application file for complete search history.

(56) References Cited

U.S. PATENT DOCUMENTS

| 6,730,863 | B1 | 5/2004 | Gerpheide et al. |
| 2005/0024065 | A1 | 2/2005 | Umeda et al. |
| 2005/0073324 | A1 | 4/2005 | Umeda et al. |
| 2005/0141263 | A1 | 6/2005 | Umeda et al. |
| 2006/0158202 | A1 | 7/2006 | Umeda et al. |
| 2007/0109274 | A1 | 5/2007 | Reynolds |
| 2009/0032312 | A1 | 2/2009 | Huang et al. |
| 2009/0128499 | A1 | 5/2009 | Izadi et al. |
| 2009/0315858 | A1 | 12/2009 | Sato et al. |
| 2010/0060591 | A1 | 3/2010 | Yousefpor et al. |
| 2010/0060593 | A1 | 3/2010 | Krah |
| 2010/0085324 | A1 | 4/2010 | Noguchi et al. |
| 2010/0127995 | A1 | 5/2010 | Rigazio et al. |
| 2010/0258361 | A1 | 10/2010 | Yamauchi et al. |
| 2011/0037724 | A1 | 2/2011 | Paulsen et al. |
| 2011/0043478 | A1 | 2/2011 | Matsushima |
| 2011/0055305 | A1 | 3/2011 | Matsushima |
| 2011/0102370 | A1 | 5/2011 | Kono et al. |
| 2011/0279391 | A1 | 11/2011 | Nakai et al. |
| 2012/0146929 | A1 | 6/2012 | Oyama |
| 2012/0223906 | A1 | 9/2012 | Zhou |
| 2013/0271426 | A1 | 10/2013 | Yumoto et al. |
| 2014/0375608 | A1 | 12/2014 | Yumoto et al. |

FOREIGN PATENT DOCUMENTS

| JP | 9-292950 A | 11/1997 |
| JP | 11-249813 A | 9/1999 |
| JP | 2000-242770 A | 9/2000 |
| JP | 2005-114362 A | 4/2005 |
| JP | 2005-134240 A | 5/2005 |
| JP | 2008-134836 A | 6/2008 |
| JP | 4364609 B2 | 11/2009 |
| JP | 4387773 B2 | 12/2009 |
| JP | 2010-92275 A | 4/2010 |
| JP | 2011-3071 A | 1/2011 |
| WO | WO 2009/107415 A1 | 9/2009 |
| WO | WO 2010/064983 A2 | 6/2010 |
| WO | WO 2010/090033 A1 | 8/2010 |
| WO | WO 2011/065249 A1 | 6/2011 |

OTHER PUBLICATIONS

Written Opinion of the International Searching Authority issued in PCT/JP2011/065419, mailed on Aug. 9, 2011.
Office Action issued on Mar. 27, 2015 for co-pending U.S. Appl. No. 14/128,910.
Office Action issued on Nov. 18, 2015 for related U.S. Appl. No. 14/129,061.
Office Action issued on Oct. 8, 2015 for related U.S. Appl. No. 14/128,910.
Office Action issued on Sep. 25, 2015 for related U.S. Appl. No. 14/129,061.
Office Action issued on Jul. 8, 2015 for co-pending U.S. Appl. No. 14/129,061.
Office Action issued on Apr. 2, 2015 in copending U.S. Appl. No. 14/129,061.
Office Action issued on May 8, 2014 for related U.S. Appl. No. 14/128,907.
U.S. Office Action dated Jun. 2, 2016, for U.S. Appl. No. 14/128,910.
Advisory Action dated Jan. 21, 2016, in related U.S. Appl. No. 14/128,910.

|  | 12x12 | | | | | | | | | | |
|---|---|---|---|---|---|---|---|---|---|---|---|
| 1 | -1 | -1 | -1 | -1 | -1 | -1 | -1 | -1 | -1 | -1 | -1 |
| 1 | 1 | -1 | 1 | -1 | -1 | -1 | 1 | 1 | 1 | -1 | 1 |
| 1 | 1 | 1 | -1 | 1 | -1 | -1 | -1 | 1 | 1 | 1 | -1 |
| 1 | -1 | 1 | 1 | -1 | 1 | -1 | -1 | -1 | 1 | 1 | 1 |
| 1 | 1 | -1 | 1 | 1 | -1 | 1 | -1 | -1 | -1 | 1 | 1 |
| 1 | 1 | 1 | -1 | 1 | 1 | -1 | 1 | -1 | -1 | -1 | 1 |
| 1 | 1 | 1 | 1 | -1 | 1 | 1 | -1 | 1 | -1 | -1 | -1 |
| 1 | -1 | 1 | 1 | 1 | -1 | 1 | 1 | -1 | 1 | -1 | -1 |
| 1 | -1 | -1 | 1 | 1 | 1 | -1 | 1 | 1 | -1 | 1 | -1 |
| 1 | -1 | -1 | -1 | 1 | 1 | 1 | -1 | 1 | 1 | -1 | 1 |
| 1 | 1 | -1 | -1 | -1 | 1 | 1 | 1 | -1 | 1 | 1 | -1 |
| 1 | -1 | 1 | -1 | -1 | -1 | 1 | 1 | 1 | -1 | 1 | 1 |

FIG. 7

|  |  |  |  |  |  |  | 20x20 |  |  |  |  |  |  |  |  |  |  |  |  |
|---|---|---|---|---|---|---|---|---|---|---|---|---|---|---|---|---|---|---|---|
| 1 | -1 | -1 | -1 | -1 | -1 | -1 | -1 | -1 | -1 | -1 | -1 | -1 | -1 | -1 | -1 | -1 | -1 | -1 | -1 |
| 1 | 1 | -1 | 1 | 1 | -1 | -1 | -1 | -1 | 1 | -1 | 1 | -1 | 1 | 1 | 1 | 1 | -1 | -1 | 1 |
| 1 | 1 | 1 | -1 | 1 | 1 | -1 | -1 | -1 | -1 | 1 | -1 | 1 | -1 | 1 | 1 | 1 | 1 | -1 | -1 |
| 1 | -1 | 1 | 1 | -1 | 1 | 1 | -1 | -1 | -1 | -1 | 1 | -1 | 1 | -1 | 1 | 1 | 1 | 1 | -1 |
| 1 | -1 | -1 | 1 | 1 | -1 | 1 | 1 | -1 | -1 | -1 | -1 | 1 | -1 | 1 | -1 | 1 | 1 | 1 | 1 |
| 1 | 1 | -1 | -1 | 1 | 1 | -1 | 1 | 1 | -1 | -1 | -1 | -1 | 1 | -1 | 1 | -1 | 1 | 1 | 1 |
| 1 | 1 | 1 | -1 | -1 | 1 | 1 | -1 | 1 | 1 | -1 | -1 | -1 | -1 | 1 | -1 | 1 | -1 | 1 | 1 |
| 1 | 1 | 1 | 1 | -1 | -1 | 1 | 1 | -1 | 1 | 1 | -1 | -1 | -1 | -1 | 1 | -1 | 1 | -1 | 1 |
| 1 | 1 | 1 | 1 | 1 | -1 | -1 | 1 | 1 | -1 | 1 | 1 | -1 | -1 | -1 | -1 | 1 | -1 | 1 | -1 |
| 1 | -1 | 1 | 1 | 1 | 1 | -1 | -1 | 1 | 1 | -1 | 1 | 1 | -1 | -1 | -1 | -1 | 1 | -1 | 1 |
| 1 | 1 | -1 | 1 | 1 | 1 | 1 | -1 | -1 | 1 | 1 | -1 | 1 | 1 | -1 | -1 | -1 | -1 | 1 | -1 |
| 1 | -1 | 1 | -1 | 1 | 1 | 1 | 1 | -1 | -1 | 1 | 1 | -1 | 1 | 1 | -1 | -1 | -1 | -1 | 1 |
| 1 | 1 | -1 | 1 | -1 | 1 | 1 | 1 | 1 | -1 | -1 | 1 | 1 | -1 | 1 | 1 | -1 | -1 | -1 | -1 |
| 1 | -1 | 1 | -1 | 1 | -1 | 1 | 1 | 1 | 1 | -1 | -1 | 1 | 1 | -1 | 1 | 1 | -1 | -1 | -1 |
| 1 | -1 | -1 | 1 | -1 | 1 | -1 | 1 | 1 | 1 | 1 | -1 | -1 | 1 | 1 | -1 | 1 | 1 | -1 | -1 |
| 1 | -1 | -1 | -1 | 1 | -1 | 1 | -1 | 1 | 1 | 1 | 1 | -1 | -1 | 1 | 1 | -1 | 1 | 1 | -1 |
| 1 | -1 | -1 | -1 | -1 | 1 | -1 | 1 | -1 | 1 | 1 | 1 | 1 | -1 | -1 | 1 | 1 | -1 | 1 | 1 |
| 1 | 1 | -1 | -1 | -1 | -1 | 1 | -1 | 1 | -1 | 1 | 1 | 1 | 1 | -1 | -1 | 1 | 1 | -1 | 1 |
| 1 | 1 | 1 | -1 | -1 | -1 | -1 | 1 | -1 | 1 | -1 | 1 | 1 | 1 | 1 | -1 | -1 | 1 | 1 | -1 |
| 1 | -1 | 1 | 1 | -1 | -1 | -1 | -1 | 1 | -1 | 1 | -1 | 1 | 1 | 1 | 1 | -1 | -1 | 1 | 1 |

FIG. 11

(a)
$$d1 = (\ 1,\ \ 1,\ \ 1,\ \ 1\ )$$
$$d2 = (\ 1,\ -1,\ \ 1,\ -1\ )$$
$$d3 = (\ 1,\ \ 1,\ -1,\ -1\ )$$
$$d4 = (\ 1,\ -1,\ -1,\ \ 1\ )$$
$$\sum_{k=1}^{4} dik \quad 4,\ \ 0,\ \ 0,\ \ 0$$

(b)
$$d1 = (\ 1,\ 0,\ \ 1,\ \ 1,\ \ 1\ )$$
$$d2 = (\ 1,\ 0,\ -1,\ \ 1,\ -1\ )$$
$$d3 = (\ 0,\ 1,\ \ 1,\ -1,\ -1\ )$$
$$d4 = (\ 0,\ 1,\ -1,\ -1,\ \ 1\ )$$
$$\sum_{k=1}^{4} dik \quad 2,\ 2,\ \ 0,\ \ 0,\ \ 0$$

(a)
$$d_1 = (d_{11}, d_{12}, \ldots, d_{1N})$$
$$d_2 = (d_{21}, d_{22}, \ldots, d_{2N})$$
$$\vdots$$
$$d_M = (d_{M1}, d_{M2}, \ldots, d_{MN})$$
(Formula 7)

$$d_i \cdot d_j = \sum_{k=1}^{N} d_{ik} \times d_{jk} = N \times \delta_{ij}$$

Where $$\delta_{ij} = 1 \quad \text{if} \quad i = j$$

$$\delta_{ij} = -1/N \quad \text{if} \quad i \neq j$$

(Formula 8)

(b)

MCS

LINEAR SYSTEM COEFFICIENT ESTIMATING METHOD, LINEAR DEVICE COLUMN VALUE ESTIMATING METHOD, CAPACITANCE DETECTING METHOD, INTEGRATED CIRCUIT, TOUCH SENSOR SYSTEM, AND ELECTRONIC DEVICE

TECHNICAL FIELD

The present invention relates to a method for estimating or detecting a coefficient, a device value, or a capacitance in a linear system configured in a matrix. The present invention further relates to an integrated circuit, a touch sensor system, and an electronic device each operating in accordance with the method.

BACKGROUND ART

There has been known a device for detecting linear device values distributed in a matrix. Patent Literature 1, for example, discloses a touch sensor device (contact detecting device) for detecting distribution of capacitance values of a capacitance matrix Cij (i=1, . . . , M and j=1, . . . , L) formed between M drive lines and L sense lines. The touch sensor device operates in accordance with a scanning detection method; specifically, the touch sensor device sequentially selects one of the drive lines and thus detects respective values of linear devices connected to the drive line selected.

Patent Literature 2 discloses a capacitance detecting circuit which (i) in driving a plurality of drive lines, switches between a first drive line group and a second drive line group on the basis of a time series code sequence, (ii) outputs a measured voltage obtained by converting, into an electric signal, a sum total of respective currents across capacitances, connected to sense lines, at a plurality of intersections of driven drive lines with the sense lines, and (iii) performs a product-sum operation of such a measured voltage and the code sequence for each sense line so as to find a voltage value corresponding to a capacitance at each intersection.

CITATION LIST

Patent Literature 1

Japanese Patent Application Publication, Tokukai, No. 2010-92275 A (Publication Date: Apr. 22, 2010)

Patent Literature 2

Japanese Patent Publication No. 4364609, specification (Publication Date: Jun. 16, 2005)

Patent Literature 3

Japanese Patent Publication No. 4387773, specification (Publication Date: Jun. 16, 2005)

Patent Literature 4

Japanese Patent Application Publication, Tokukai, No. 2005-114362 A (Publication Date: Apr. 28, 2005)

Patent Literature 5

Japanese Patent Application Publication, Tokukai, No. 2005-134240 A (Publication Date: May 26, 2005)

SUMMARY OF INVENTION

Technical Problem

The touch sensor device of Patent Literature 1 operating in accordance with the scanning detection method is, however, disadvantageous in that the touch sensor device is required to complete within a period of time (T/m) a process of simultaneously selecting and scanning a plurality of lines so as to detect capacitances of the capacitance matrix Cij. For the above symbol T/m, T represents a period of time given to obtain two-dimensionally distributed capacitance values, and m represents a number of scans.

Accuracy of a detecting process can generally be better improved by a process such as averaging, as a process time is longer. On the other hand, (i) the period of time T given to obtain capacitance values needs to be shorter in order for the touch sensor device to follow a high-speed operation, and (ii) the number M of scans needs to be larger for improvement of resolution. Either of (i) and (ii) problematically reduces the process time (T/m) and thus decreases detection accuracy.

The capacitance detecting circuit of Patent Literature 2, to cancel an offset error in a measured voltage, (i) switches between driving the first drive line group and driving the second drive line group on the basis of a code sequence and (ii) subtracts a measured voltage based on the driving of the second drive line group from a measured voltage based on the driving of the first drive line group (see the specification, paragraphs [0058] and [0061]). The capacitance detecting circuit, however, carries out a two-stage operation and is problematically less effective in simultaneously achieving a high-speed operation and power consumption reduction.

It is an object of the present invention to provide a linear system coefficient estimating method, a linear device column value estimating method, a capacitance detecting method, an integrated circuit, a touch sensor system, and an electronic device each of which (i) achieves both a high detection accuracy and a high resolution and (ii) allows a high-speed operation.

Solution to Problem

In order to solve the above problem, a linear system coefficient estimating method of the present invention includes the steps of: (A) (a) inputting, on a basis of M code sequences di (=di1, di2, . . . , diN, where i=1, . . . , M) which are orthogonal to one another and each of which has a length N, M inputs Xk (k=1, . . . , M) to a system which has a linear input and output and to which the M inputs Xk (k=1, . . . , M) are to be inputted, the system being represented by $$F(X1, \ldots, XM) = \sum_{i=1}^{M} (Ci \times Xi),$$

and (b) outputting N outputs s=(s1, s2, . . . , sN)=(F (d11, d21, . . . , dM1), F (d12, d22, . . . , dM2), . . . , F (d1N, d2N, . . . , dMN)); and (B) estimating, on a basis of an inner product operation of the outputs s and the code sequences di, a coefficient Ck corresponding to a k-th input Xk.

With the above feature, the linear system coefficient estimating method inputs M inputs Xk (k=1, . . . , M) on the basis of M code sequences di (=di1, di2, . . . , diN, where i=1, . . . , M) which are orthogonal to one another and each of which has a length N and outputs N outputs s=(s1, s2, ..., sN)=(F (d11, d21, ..., dM1), F (d12, d22, ..., dM2), ..., F (d1N, d2N, ..., dMN)). The linear system coefficient estimating method thus estimates a coefficient Ck of the linear system by simultaneously inputting all the M inputs. The linear system coefficient estimating method consequently (i) eliminates the need to sequentially select one of M inputs and scan it for an input as in conventional arrangements and (ii) even with an increase in the number M of inputs, does not shorten a process time for obtaining a coefficient value of the linear system. The linear system coefficient estimating method thus maintains a good detection accuracy and achieves a good resolution and a high-speed operation.

Another linear system coefficient estimating method of the present invention includes the steps of: (A) (a) inputting, on a basis of M code sequences di (=di1, di2, ..., diN, where i=1, ..., M) which are orthogonal to one another and each of which has a length N, M inputs Xk (k=1, ..., M) to each of a first system and a second system each of which has a linear input and output and to each of which the M inputs Xk (k=1, ..., M) are to be inputted, the first and second systems being represented by $$F1(X1, \ldots, XM) = \sum_{i=1}^{M} (C1i \times Xi)$$

$$F2(X1, \ldots, XM) = \sum_{i=1}^{M} (C2i \times Xi),$$

and (b) outputting N outputs sFirst=(s11, s12, ..., s1N)=(F1 (d11, d21, ..., dM1), F1 (d12, d22, ..., dM2), ..., F1 (d1N, d2N, ..., dMN)) from the first system and N outputs sSecond=(s21, s22, ..., s2N)=(F2 (d11, d21, ..., dM1), F2 (d12, d22, ..., dM2), ..., F2 (d1N, d2N, ..., dMN)) from the second system; and (B) estimating (a) on a basis of a first inner product operation of the outputs sFirst and the code sequences di, a coefficient C1k of the first system which coefficient C1k corresponds to a k1-th input Xk and (b) on a basis of a second inner product operation of the outputs sSecond and the code sequences di, a coefficient C2k of the second system which coefficient C2k corresponds to a k2-th input Xk.

With the above feature, the linear system coefficient estimating method inputs M inputs xk (k=1, ..., M) on the basis of M code sequences di (=di1, di2, ..., diN, where i=1, ..., M) which are orthogonal to one another and each of which has a length N, and outputs N outputs sFirst=(s11, s12, ..., s1N)=(F1 (d11, d21, ..., dM1), F1 (d12, d22, ..., dM2), ..., F1 (d1N, d2N, ..., dMN)) from the first system and N outputs sSecond=(s21, s22, ..., s2N)= (F2 (d11, d21, ..., dM1), F2 (d12, d22, ..., dM2), ..., F2 (d1N, d2N, ..., dMN)) from the second system. The linear system coefficient estimating method thus estimates a coefficient C1k of the first system and a coefficient C2k of the second system by simultaneously inputting all the M inputs. The linear system coefficient estimating method consequently (i) eliminates the need to sequentially select one of M inputs and scan it for an input as in conventional arrangements and (ii) even with an increase in the number M of inputs, does not shorten a process time for obtaining coefficient values of the first and second linear systems. The linear system coefficient estimating method thus maintains a good detection accuracy and achieves a good resolution and a high-speed operation.

A linear device column value estimating method of the present invention includes the steps of: (A) (a) driving, on a basis of M code sequences di (=di1, di2, ..., diN, where i=1, ..., M) which are orthogonal to one another and each of which has a length N, M drive lines in parallel for each of (I) a first linear device column C1i (i=1, ..., M) formed between the M drive lines and a first sense line and (II) a second linear device column C2i (i=1, ..., M) formed between the M drive lines and a second sense line, and thus (b) outputting N outputs sFirst=(s11, s12, ..., s1N) from the first linear device column and N outputs sSecond=(s21, s22, ..., s2N) from the second linear device column; and (B) estimating (a) on a basis of a first inner product operation of the outputs sFirst and the code sequences di, a first linear device value in the first linear device column which first linear device value corresponds to a k1-th drive line and (b) on a basis of a second inner product operation of the outputs sSecond and the code sequences di, a second linear device value in the second linear device column which second linear device value corresponds to a k2-th drive line.

With the above feature, the linear device column value estimating method (a) drives M drive lines in parallel on the basis of M code sequences di (=di1, di2, ..., diN, where i=1, ..., M) which are orthogonal to one another and each of which has a length N, and (b) outputs N outputs sFirst= (s11, s12, ..., s1N) from the first linear device column and N outputs sSecond=(s21, s22, ..., s2N) from the second linear device column. The linear device column value estimating method thus estimates (a) a first linear device value in the first linear device column and (b) a second linear device value in the second linear device column by simultaneously driving all the M drive lines. The linear device column value estimating method consequently (i) eliminates the need to sequentially select one of M drive lines and scan it for an input as in conventional arrangements, and (ii) extends a process time for obtaining a first linear device value in the first linear device column and a second linear device value in the second linear device column. The linear device column value estimating method thus maintains a good detection accuracy and achieves a good resolution and a high-speed operation.

A capacitance detecting method of the present invention includes the steps of: (A) (a) driving, on a basis of code sequences di (=di1, di2, ..., diN, where i=1, ..., M) which are orthogonal to one another and include elements each being either +1 or −1 and each of which has a length N, M drive lines in parallel for each of (I) a first capacitance column C1i (i=1, ..., M) formed between the M drive lines and a first sense line and (II) a second capacitance column C2i (i=1, ..., M) formed between the M drive lines and a second sense line, so that a voltage +V is applied for an element of +1 in the code sequences and that a voltage −V is applied for an element of −1 in the code sequences, and thus (b) outputting outputs sFirst=(s11, s12, ..., s1N) from the first capacitance column and outputs sSecond=(s21, s22, ..., s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line.

With the above feature, the capacitance detecting method (a) drives, on the basis of code sequences di (=di1, di2, ..., diN, where i=1, ..., M) which are orthogonal to one another and include elements each being either +1 or −1 and each of which has a length N, M drive lines in parallel so that a voltage +V is applied for an element of +1 in the code sequences and that a voltage −V is applied for an element of −1 in the code sequences, and (b) outputs outputs sFirst=(s11, s12, . . . , s1N) from the first capacitance column and outputs sSecond=(s21, s22, . . . , s2N) from the second capacitance column. The capacitance detecting method thus estimates, by simultaneously driving all the M drive lines, (a) a first capacitance value in the first capacitance column which first capacitance value corresponds to the k1-th drive line and (b) a second capacitance value in the second capacitance column which second capacitance value corresponds to the k2-th drive line. The capacitance detecting method consequently (i) eliminates the need to sequentially select one of M drive lines and scan it for an input as in conventional arrangements, and (ii) extends a process time for obtaining (a) a first capacitance value in the first capacitance column which first capacitance value corresponds to the k1-th drive line and (b) a second capacitance value in the second capacitance column which corresponds to the k2-th drive line. The capacitance detecting method thus maintains a good detection accuracy and achieves a good resolution and a high-speed operation.

Further, the capacitance detecting method drives all the M drive lines in parallel each at either a voltage +V or a voltage −V in accordance with the code sequences. The capacitance detecting method thus (i) increases an amount of information contained in output signals from a capacitance column and (ii) improves a S/N ratio, as compared to the arrangement of Patent Literature 2, which groups the drive lines for driving in accordance with code sequences. The capacitance detecting method simply carries out a single-stage operation as compared to the arrangement of Patent Literature 2, which carries out a two-stage operation, and is consequently advantageous in achieving a high-speed operation.

An integrated circuit of the present invention includes: a drive section for (a) driving, on a basis of code sequences di (=di1, di2, . . . , diN, where i=1, . . . , M) which are orthogonal to one another and include elements each being either +1 or −1 and each of which has a length N, M drive lines in parallel for each of (I) a first capacitance column C1i (i=1, . . . , M) formed between the M drive lines and a first sense line and (II) a second capacitance column C2i (i=1, . . . , M) formed between the M drive lines and a second sense line, so that a voltage +V is applied for an element of +1 in the code sequences and that a voltage −V is applied for an element of −1 in the code sequences, and thus (b) outputting outputs sFirst=(s11, s12, . . . , s1N) from the first capacitance column and outputs sSecond=(s21, s22, . . . , s2N) from the second capacitance column; and an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line.

With the above feature, the drive section (a) drives, on the basis of code sequences di (=di1, di2, . . . , diN, where i=1, . . . , M) which are orthogonal to one another and include elements each being either +1 or −1 and each of which has a length N, M drive lines in parallel so that a voltage +V is applied for an element of +1 in the code sequences and that a voltage −V is applied for an element of −1 in the code sequences, and thus (b) outputs outputs sFirst=(s11, s12, . . . , s1N) from the first capacitance column and outputs sSecond=(s21, s22, . . . , s2N) from the second capacitance column. The integrated circuit thus estimates, by driving all the M drive lines, (a) a first capacitance value in the first capacitance column which first capacitance value corresponds to the k1-th drive line and (b) a second capacitance value in the second capacitance column which second capacitance value corresponds to the k2-th drive line. The integrated circuit for use in a capacitance detecting method consequently (i) eliminates the need to sequentially select one of M drive lines and scan it for an input as in conventional arrangements, and (ii) extends a process time for estimating (a) a first capacitance value in the first capacitance column which first capacitance value corresponds to the k1-th drive line and (b) a second capacitance value in the second capacitance column which corresponds to the k2-th drive line. The capacitance detecting method thus maintains a good detection accuracy and achieves a good resolution and a high-speed operation.

Further, the capacitance detecting method drives all the M drive lines in parallel each at either a voltage +V or a voltage −V in accordance with the code sequences. The capacitance detecting method thus (i) increases an amount of information contained in output signals from a capacitance column and (ii) improves a S/N ratio, as compared to the arrangement of Patent Literature 2, which groups the drive lines for driving in accordance with code sequences. The capacitance detecting method simply carries out a single-stage operation as compared to the arrangement of Patent Literature 2, which carries out a two-stage operation, and is consequently advantageous in achieving a high-speed operation.

A touch sensor system of the present invention includes: a sensor panel including (I) a first capacitance column C1i (i=1, . . . , M) formed between M drive lines and a first sense line and (II) a second capacitance column C2i (i=1, . . . , M) formed between the M drive lines and a second sense line; and an integrated circuit for controlling the sensor panel, the integrated circuit including: a drive section for (a) driving, on a basis of code sequences di (=di1, di2, . . . , diN, where i=1, . . . , M) which are orthogonal to one another and include elements each being either +1 or −1 and each of which has a length N, the M drive lines in parallel for each of (I) the first capacitance column C1i (i=1, . . . , M) and (II) the second capacitance column C2i (i=1, . . . , M) so that a voltage +V is applied for an element of +1 in the code sequences and that a voltage −V is applied for an element of −1 in the code sequences, and thus (b) outputting outputs sFirst=(s11, s12, . . . , s1N) from the first capacitance column and outputs sSecond=(s21, s22, . . . , s2N) from the second capacitance column; and an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line.

With the above feature, the drive section (a) drives, on the basis of code sequences di (=di1, di2, . . . , diN, where i=1, . . . , M) which are orthogonal to one another and include elements each being either +1 or −1 and each of which has a length N, M drive lines in parallel so that a voltage +V is applied for an element of +1 in the code sequences and that a voltage −V is applied for an element of −1 in the code sequences, and thus (b) outputs outputs sFirst=(s11, s12, . . . , s1N) from the first capacitance column and outputs sSecond=(s21, s22, . . . , s2N) from the second capacitance column. The touch sensor system thus estimates, by driving all the M drive lines, (a) a first capacitance value in the first capacitance column which first capacitance value corresponds to the k1-th drive line and (b) a second capacitance value in the second capacitance column which second capacitance value corresponds to the k2-th drive line. The touch sensor system consequently (i) eliminates the need to sequentially select one of M drive lines and scan it for an input as in conventional arrangements, and (ii) extends a process time for estimating (a) a first capacitance value in the first capacitance column which first capacitance value corresponds to the k1-th drive line and (b) a second capacitance value in the second capacitance column which corresponds to the k2-th drive line. The capacitance detecting method thus maintains a good detection accuracy and achieves a good resolution and a high-speed operation.

Further, the capacitance detecting method drives all the M drive lines in parallel each at either a voltage +V or a voltage −V in accordance with the code sequences. The capacitance detecting method thus (i) increases an amount of information contained in output signals from a capacitance column and (ii) improves a S/N ratio, as compared to the arrangement of Patent Literature 2, which groups the drive lines for driving in accordance with code sequences. The capacitance detecting method simply carries out a single-stage operation as compared to the arrangement of Patent Literature 2, which carries out a two-stage operation, and is consequently advantageous in achieving a high-speed operation.

An electronic device of the present invention includes: the touch sensor system of the present invention; and a display panel which either is placed on the sensor panel included in the touch sensor system or contains the sensor panel.

With the above feature, the drive section (a) drives, on the basis of code sequences di (=di1, di2, . . . , diN, where i=1, . . . , M) which are orthogonal to one another and include elements each being either +1 or −1 and each of which has a length N, M drive lines in parallel so that a voltage +V is applied for an element of +1 in the code sequences and that a voltage −V is applied for an element of −1 in the code sequences, and thus (b) outputs outputs sFirst=(s11, s12, . . . , s1N) from the first capacitance column and outputs sSecond=(s21, s22, . . . , s2N) from the second capacitance column. The touch sensor system thus estimates, by driving all the M drive lines, (a) a first capacitance value in the first capacitance column which first capacitance value corresponds to the k1-th drive line and (b) a second capacitance value in the second capacitance column which second capacitance value corresponds to the k2-th drive line. The electronic device including the touch sensor system consequently (i) eliminates the need to sequentially select one of M drive lines and scan it for an input as in conventional arrangements, and (ii) extends a process time for estimating (a) a first capacitance value in the first capacitance column which first capacitance value corresponds to the k1-th drive line and (b) a second capacitance value in the second capacitance column which corresponds to the k2-th drive line. The capacitance detecting method thus maintains a good detection accuracy and achieves a good resolution and a high-speed operation.

Further, the capacitance detecting method drives all the M drive lines in parallel each at either a voltage +V or a voltage −V in accordance with the code sequences. The capacitance detecting method thus (i) increases an amount of information contained in output signals from a capacitance column and (ii) improves a S/N ratio, as compared to the arrangement of Patent Literature 2, which groups the drive lines for driving in accordance with code sequences. The capacitance detecting method simply carries out a single-stage operation as compared to the arrangement of Patent Literature 2, which carries out a two-stage operation, and is consequently advantageous in achieving a high-speed operation.

A capacitance detecting method of the present invention includes the steps of: (A) (a) driving, on a basis of code sequences di (=di1, di2, . . . , diN, where i=1, . . . , M) which are orthogonal to one another and Include elements each being either +1 or −1 and each of which has a length N, M drive lines in parallel for each of (I) a first capacitance column Ci1 (i=1, . . . , M) formed between the M drive lines and a first sense line and (II) a second capacitance column Ci2 (i=1, . . . , M) formed between the M drive lines and a second sense line, and thus (b) outputting, to an analog integrator, outputs sFirst=(s11, s12, . . . , s1N) from the first capacitance column and outputs sSecond=(s21, s22, . . . , s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the step (A) driving, when the analog integrator is reset, the M drive lines at a first voltage represented by a voltage Vref and driving, when the outputs sFirst and sSecond from the first and second capacitance columns are sampled, the M drive lines at (i) a second voltage for an element of +1 in the code sequences, the second voltage being represented by a voltage (Vref+V), and (ii) a third voltage for an element of −1 in the code sequences, the third voltage being represented by a voltage (Vref−V).

The above feature makes it possible to drive the drive lines in parallel with use of a simple configuration on the basis of code sequences.

A capacitance detecting method of the present invention includes the steps of: (A) (a) driving, on a basis of code sequences di (=di1, di2, . . . , diN, where i=1, . . . , M) which are orthogonal to one another and include elements each being either +1 or −1 and each of which has a length N, M drive lines in parallel for each of (I) a first capacitance column Ci1 (i=1, . . . , M) formed between the M drive lines and a first sense line and (II) a second capacitance column Ci2 (i=1, . . . , M) formed between the M drive lines and a second sense line, and thus (b) outputting, to an analog integrator, outputs sFirst=(s11, s12, . . . , s1N) from the first capacitance column and outputs sSecond=(s21, s22, . . . , s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the step (A), for an element of +1 in the code sequences, driving the drive lines at (i) a first voltage when the analog integrator is reset and (ii) a second voltage when the outputs sFirst and sSecond from the first and second capacitance columns are sampled and, for an element of −1 in the code sequences, driving the drive lines at (i) the second voltage when the analog integrator is reset and (ii) the first voltage when the outputs sFirst and sSecond from the first and second capacitance columns are sampled.

The above feature makes it possible to achieve a higher signal intensity and thus increase an electric charge stored in a capacitance.

A capacitance detecting method of the present invention includes the steps of: (A) (a) driving, on a basis of code sequences di (=di1, di2, . . . , diN, where i=1, . . . , M) which are orthogonal to one another and include elements each being either +1 or −1 and each of which has a length N, M drive lines in parallel for each of (I) a first capacitance column Ci1 (i=1, . . . , M) formed between the M drive lines and a first sense line and (II) a second capacitance column Ci2 (i=1, . . . , M) formed between the M drive lines and a second sense line, and thus (b) outputting, to an analog integrator, outputs sFirst=(s11, s12, . . . , s1N) from the first capacitance column and outputs sSecond=(s21, s22, . . . , s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the capacitance detecting method further including, before the step (A), the step of: (C) (a) driving, when the analog integrator is reset and when the outputs sFirst and sSecond from the first and second capacitance columns are sampled, the drive lines at a first voltage so that the outputs sFirst and sSecond from the first and second capacitance columns are outputted to the analog integrator, (b) reading out, from the analog integrator, the outputs sFirst and sSecond from the first and second capacitance columns as first offset outputs and second offset outputs, respectively, and (c) storing the first and second offset outputs in a memory.

The above feature makes it possible to cancel an offset caused by an analog integrator.

An integrated circuit of the present invention includes: a drive section for (a) driving, on a basis of code sequences di (=di1, di2, . . . , diN, where i=1, . . . , M) which are orthogonal to one another and include elements each being either +1 or −1 and each of which has a length N, M drive lines in parallel for each of (I) a first capacitance column Ci1 (i=1, . . . , M) formed between the M drive lines and a first sense line and (II) a second capacitance column Ci2 (i=1, . . . , M) formed between the M drive lines and a second sense line, and thus (b) outputting, to an analog integrator, outputs sFirst=(s11, s12, . . . , s1N) from the first capacitance column and outputs sSecond=(s21, s22, . . . , s2N) from the second capacitance column; and an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the drive section, for an element of +1 in the code sequences, driving the drive lines at (i) a first voltage when the analog integrator is reset and (ii) a second voltage when the outputs sFirst and sSecond from the first and second capacitance columns are sampled and, for an element of −1 in the code sequences, driving the drive lines at (i) the second voltage when the analog integrator is reset and (ii) the first voltage when the outputs sFirst and sSecond from the first and second capacitance columns are sampled.

The above feature makes it possible to achieve a higher signal intensity and thus increase an electric charge stored in a capacitance.

An integrated circuit of the present invention includes: a drive section for (a) driving, on a basis of code sequences di (=di1, di2, . . . , diN, where i=1, . . . , M) which are orthogonal to one another and include elements each being either +1 or −1 and each of which has a length N, M drive lines in parallel for each of (I) a first capacitance column Ci1 (i=1, . . . , M) formed between the M drive lines and a first sense line and (II) a second capacitance column Ci2 (i=1, . . . , M) formed between the M drive lines and a second sense line, and thus (b) outputting, to an analog integrator, outputs sFirst=(s11, s12, . . . , s1N) from the first capacitance column and outputs sSecond=(s21, s22, . . . , s2N) from the second capacitance column; and an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the drive section, before outputting the outputs sFirst and sSecond from the first and second capacitance columns to the analog integrator, (a) driving, when the analog integrator is reset and when the outputs sFirst and sSecond from the first and second capacitance columns are sampled, the drive lines at a first voltage so that the outputs sFirst and sSecond from the first and second capacitance columns are outputted to the analog integrator, (b) reading out, from the analog integrator, the outputs sFirst and sSecond from the first and second capacitance columns as first offset outputs and second offset outputs, respective, and (c) storing the first and second offset outputs in a memory.

The above feature makes it possible to cancel an offset caused by an analog integrator.

A touch sensor system of the present invention includes: a sensor panel including (I) a first capacitance column Ci1 (i=1, . . . , M) formed between M drive lines and a first sense line and (II) a second capacitance column Ci2 (i=1, . . . , M) formed between the M drive lines and a second sense line; and an integrated circuit for controlling the sensor panel, the integrated circuit including: a drive section for (a) driving, on a basis of code sequences di (=di1, di2, . . . , diN, where i=1, . . . , M) which are orthogonal to one another and include elements each being either +1 or −1 and each of which has a length N, the M drive lines in parallel for each of (I) the first capacitance column Ci1 (i=1, . . . , M) and (II) the second capacitance column Ci2 (i=1, . . . , M), and thus (b) outputting, to an analog integrator, outputs sFirst=(s11, s12, . . . , s1N) from the first capacitance column and outputs sSecond=(s21, s22, . . . , s2N) from the second capacitance column; and an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the drive section, for an element of +1 in the code sequences, driving the drive lines at (i) a first voltage when the analog integrator is reset and (ii) a second voltage when the outputs sFirst and sSecond from the first and second capacitance columns are sampled and, for an element of −1 in the code sequences, driving the drive lines at (i) the second voltage when the analog integrator is reset and (ii) the first voltage when the outputs sFirst and sSecond from the first and second capacitance columns are sampled.

The above feature makes it possible to achieve a higher signal intensity and thus increase an electric charge stored in a capacitance.

A touch sensor system of the present invention includes: a sensor panel including (I) a first capacitance column Ci1 (i=1, ..., M) formed between M drive lines and a first sense line and (II) a second capacitance column Ci2 (i=1, ..., M) formed between the M drive lines and a second sense line; and an integrated circuit for controlling the sensor panel, the integrated circuit including: a drive section for (a) driving, on a basis of code sequences di (=di1, di2, ..., diN, where i=1, ..., M) which are orthogonal to one another and include elements each being either +1 or −1 and each of which has a length N, the M drive lines in parallel for each of (I) the first capacitance column Ci1 (i=1, ..., M) and (II) the second capacitance column Ci2 (i=1, ..., M), and thus (b) outputting, to an analog integrator, outputs sFirst=(s11, s12, ..., s1N) from the first capacitance column and outputs sSecond=(s21, s22, ..., s2N) from the second capacitance column; and an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the drive section, before outputting the outputs sFirst and sSecond from the first and second capacitance columns to the analog integrator, (a) driving, when the analog integrator is reset and when the outputs sFirst and sSecond from the first and second capacitance columns are sampled, the drive lines at a first voltage so that the outputs sFirst and sSecond from the first and second capacitance columns are outputted to the analog integrator, (b) reading out, from the analog integrator, the outputs sFirst and sSecond from the first and second capacitance columns as first offset outputs and second offset outputs, respectively, and (c) storing the first and second offset outputs in a memory.

The above feature makes it possible to cancel an offset caused by an analog integrator.

An electronic device of the present invention includes: a touch sensor system of the present invention; and a display panel which either is placed on the sensor panel included in the touch sensor system or contains the sensor panel.

A capacitance detecting method of the present invention includes the steps of: (A) (a) driving, on a basis of code sequences di (=di1, di2, ..., diN, where i=1, ..., M) which are orthogonal to one another and include elements each being either +1 or −1 and each of which has a length N, M drive lines in parallel for each of (I) a first capacitance column Ci1 (i=1, ..., M) formed between the M drive lines and a first sense line and (II) a second capacitance column Ci2 (i=1, ..., M) formed between the M drive lines and a second sense line, so that a voltage +V is applied for an element of +1 in the code sequences and that a voltage −V is applied for an element of −1 in the code sequences, and thus (b) outputting, to an analog integrator, outputs sFirst= (s11, s12, ..., s1N) from the first capacitance column and outputs sSecond=(s21, s22, ..., s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the step (A), to prevent saturation of the analog integrator, switching a gain of the analog integrator in accordance with an absolute value of a sum total of corresponding elements present in the code sequences along a column direction.

The above feature makes it possible to prevent saturation of an analog integrator.

A capacitance detecting method of the present invention includes the steps of: (A) (a) driving, on a basis of code sequences di (=di1, di2, ..., diN, where i=1, ..., M) which are orthogonal to one another and include elements each being either +1 or −1 and each of which has a length N, M drive lines in parallel for each of (I) a first capacitance column Ci1 (i=1, ..., M) formed between the M drive lines and a first sense line and (II) a second capacitance column Ci2 (i=1, ..., M) formed between the M drive lines and a second sense line, so that a voltage +V is applied for an element of +1 in the code sequences and that a voltage −V is applied for an element of −1 in the code sequences, and thus (b) outputting, to an analog integrator, outputs sFirst= (s11, s12, ..., s1N) from the first capacitance column and outputs sSecond=(s21, s22, ..., s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the step (A), to prevent saturation of the analog integrator, dividing, in accordance with an absolute value of a sum total of corresponding elements present in the code sequences along a column direction, a column of the code sequences into a plurality of columns so as to divide the driving of the M drive lines into a plurality of drivings.

The above feature makes it possible to prevent saturation of an analog integrator.

A capacitance detecting method of the present invention includes the steps of: (A) (a) driving, on a basis of code sequences di (=di1, di2, ..., diN, where i=1, ..., M) which are orthogonal to one another and include elements each being +1 or −1 and each of which has a code length N=M, the code sequences di corresponding to respective rows of a $2^n$-dimensional Hadamard matrix created by Sylvester method, (M=$2^n$) drive lines in parallel for each of (I) a first capacitance column Ci1 (i=1, ..., M) formed between the (M=$2^n$) drive lines and a first sense line and (II) a second capacitance column Ci2 (i=1, ..., M) formed between the (M $2^n$) drive lines and a second sense line, so that a voltage +V is applied for an element of +1 in the code sequences and that a voltage −V is applied for an element of −1 in the code sequences, and thus (b) outputting, to an analog integrator, outputs sFirst=(s11, s12, ..., s1N) from the first capacitance column and outputs sSecond=(s21, s22, ..., s2N) from the second capacitance column; and (B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line, the step (A), to prevent saturation of the analog integrator, dividing a first column of the code sequences into a plurality of columns so as to divide a driving for the first column of the code sequences into a plurality of drivings.

The above feature makes it possible to prevent saturation of an analog integrator.

A capacitance detecting method of the present invention includes the steps of: (A) (a) driving, on a basis of first code sequences di (=di1, di2, . . . , diN, where i=1, . . . , M) which are orthogonal to one another and include elements each being +1 or −1 and each of which has a code length N>M, the first code sequences di corresponding to respective rows of a $2^n$-dimensional (where M<$2^n$) Hadamard matrix created by Sylvester method, M drive lines in parallel for each of (I) a first capacitance column Ci1 (i=1, . . . , M) formed between the M drive lines and a first sense line and (II) a second capacitance column Ci2 (i=1, . . . , M) formed between the M drive lines and a second sense line, so that a voltage +V is applied for an element of +1 in the first code sequences and that a voltage −V is applied for an element of −1 in the first code sequences, and thus (b) outputting, to an analog integrator, outputs sFirst=(s11, s12, . . . , s1N) from the first capacitance column and outputs sSecond=(s21, s22, . . . , s2N) from the second capacitance column; and (B) estimating (a) on a basis of a first inner product operation of the outputs sFirst and the first code sequences di, a first capacitance value in the first capacitance column which first capacitance value corresponds to a k1-th drive line and (b) on a basis of a second inner product operation of the outputs sSecond and the first code sequences di, a second capacitance value in the second capacitance column which second capacitance value corresponds to a k2-th drive line, the step (A) dividing a particular column of the first code sequences into a plurality of columns, the particular column having an absolute value of a sum total of corresponding elements present in the first code sequences along a column direction which absolute value exceeds a threshold Num for saturation of the analog integrator, so as to divide a driving for the particular column into a plurality of drivings.

The above feature makes it possible to prevent saturation of an analog integrator in a driving based on a $2^n$-dimensional (where M<$2^n$) Hadamard matrix.

Advantageous Effects of Invention

The linear system coefficient estimating method of the present invention inputs M inputs Xk (k=1, . . . , M) on the basis of M code sequences di (=di1, di2, . . . , diN, where i=1, . . . , M) which are orthogonal to one another and each of which has a length N and outputs N outputs s=(s1, s2, . . . , sN)=(F (d11, d21, . . . , dM1), F (d12, d22, . . . , dM2), . . . , F (d1N, d2N, . . . , dMN)). The linear system coefficient estimating method thus estimates a coefficient Ck of the linear system by simultaneously inputting all the M inputs. The linear system coefficient estimating method consequently (i) eliminates the need to sequentially select one of M inputs and scan it for an input as in conventional arrangements and (ii) even with an increase in the number M of inputs, does not shorten a process time for obtaining a coefficient value of the linear system. The linear system coefficient estimating method thus maintains a good detection accuracy and achieves a good resolution and a high-speed operation.

BRIEF DESCRIPTION OF DRAWINGS

FIG. 5 is a diagram illustrating a first specific example of orthogonal code sequences as an input to the sensor panel included in the touch sensor system.

FIG. 6 is a diagram illustrating a second specific example of the orthogonal code sequences.

FIG. 7 is a diagram illustrating a third specific example of the orthogonal code sequences.

(a) and (b) of FIG. 11 are each a diagram illustrating a code sequence for use in driving a sensor panel of Embodiment 4.

Figure 12:
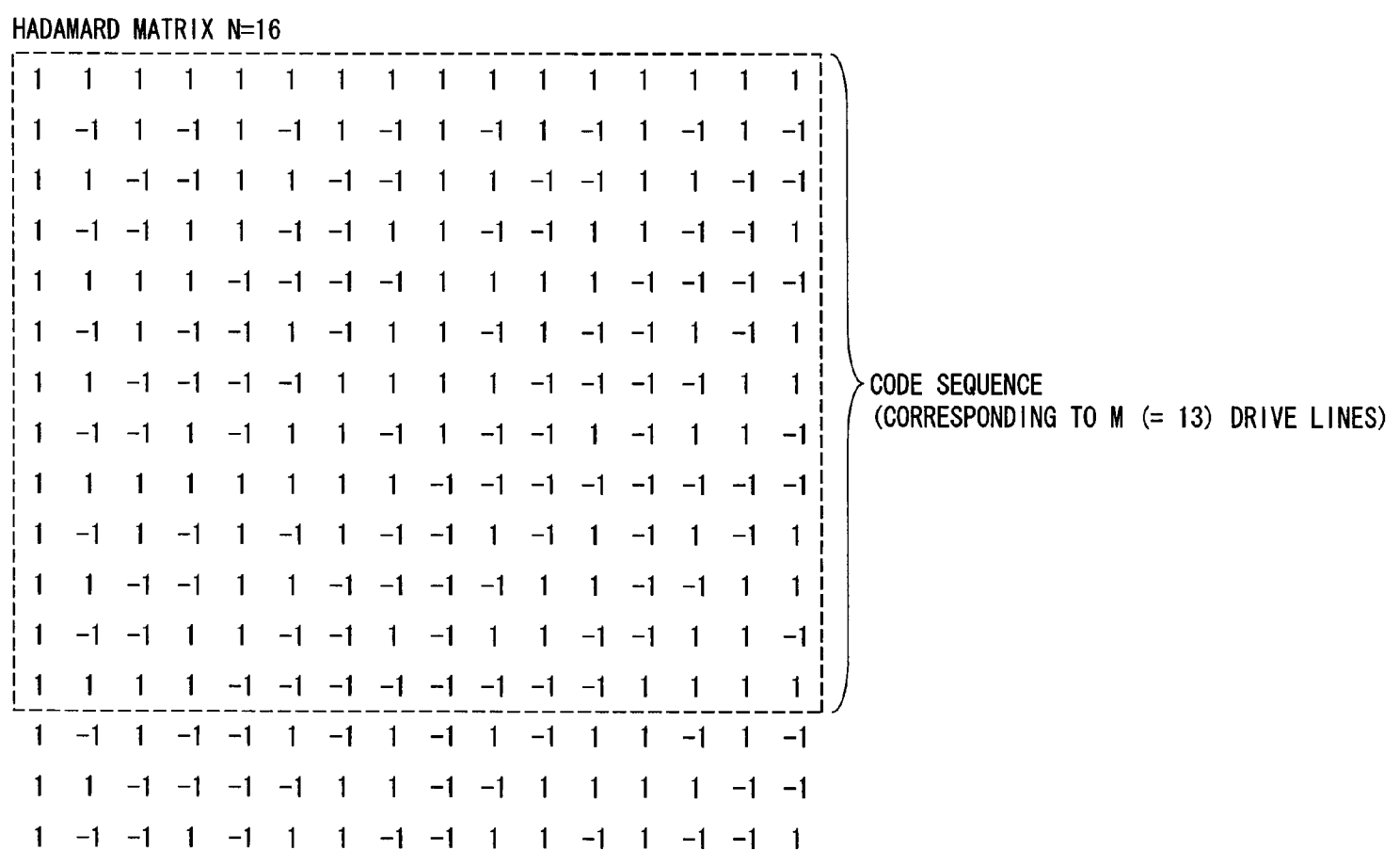

FIG. 12 is a diagram illustrating a code sequence for use in driving a sensor panel of Embodiment 5.

Figure 13:
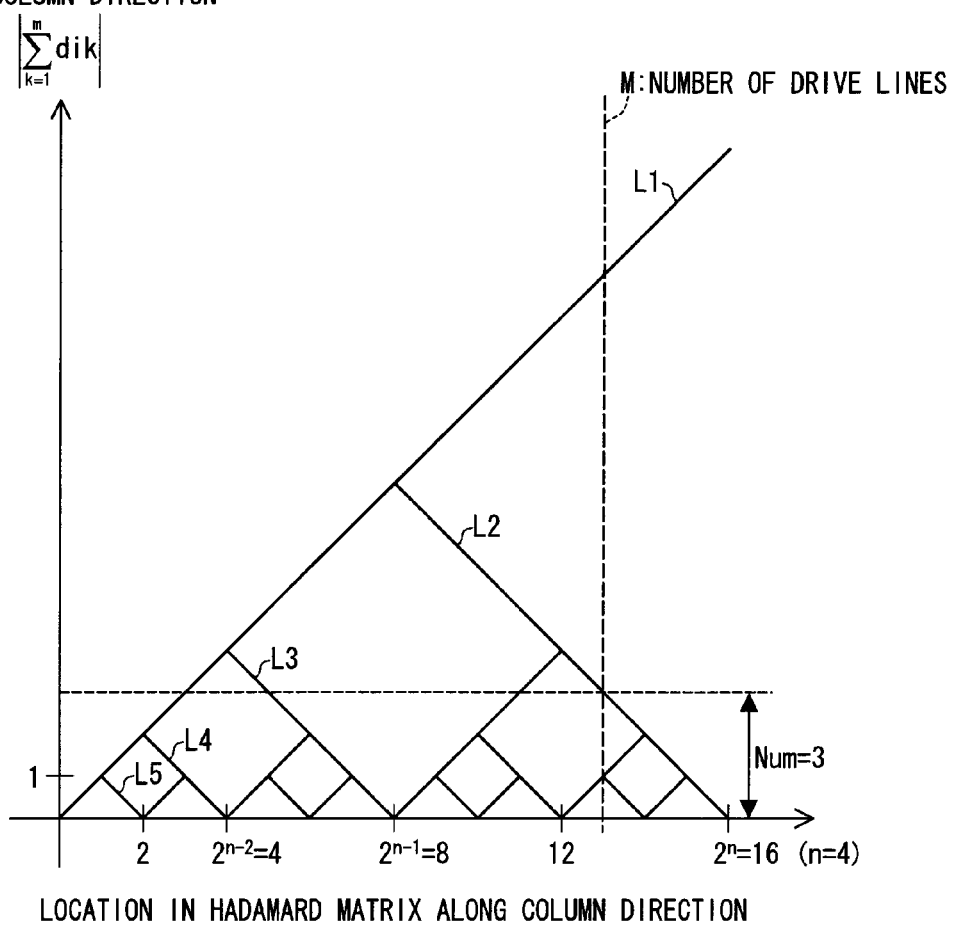

FIG. 13 is a graph illustrating a method for driving the sensor panel.

(a) is a diagram for explaining code sequences of the above Embodiments which code sequences are based on an M-sequence, and (b) is a diagram illustrating a specific example of the code sequences based on an M-sequence.

Figure 15:
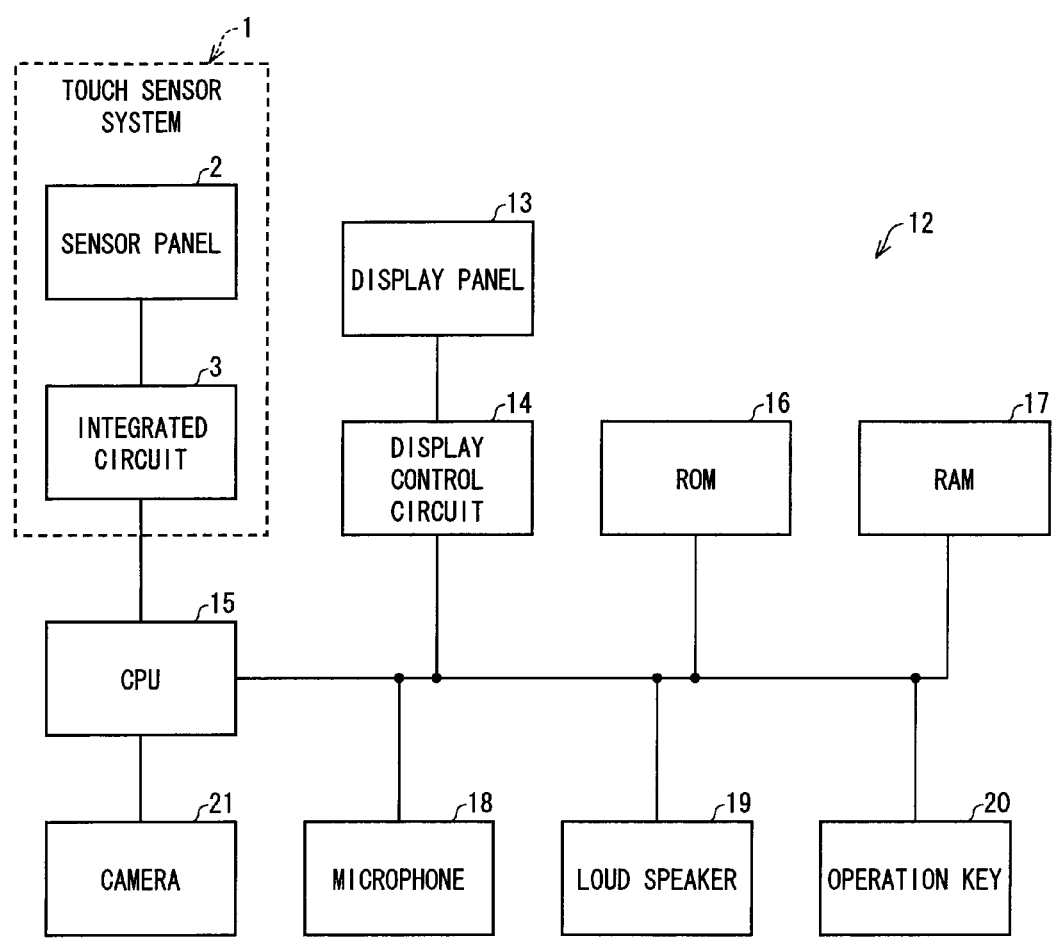

FIG. 15 is a functional block diagram illustrating a configuration of a mobile telephone including the touch sensor system.

DESCRIPTION OF EMBODIMENTS

Embodiments of a touch sensor system of the present invention are described below with reference to FIGS. 1 through 15.

(Embodiment 1)
(Configuration of Touch Sensor System of Embodiment 1)

Figure 1:
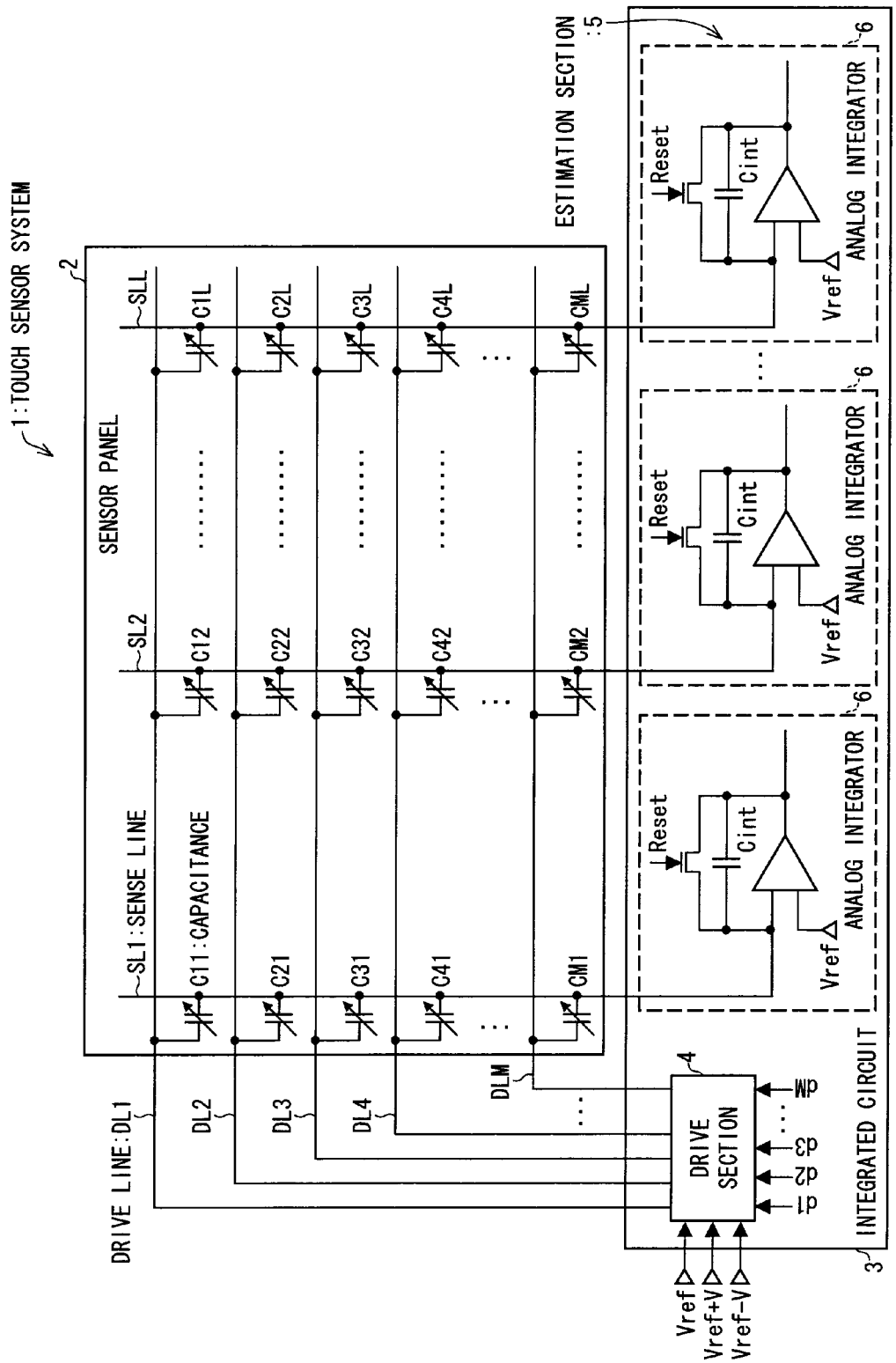
FIG. 1 is a circuit diagram illustrating a configuration of a touch sensor system of a first embodiment.

FIG. 1 is a circuit diagram illustrating a configuration of a touch sensor system 1 of the present embodiment. The touch sensor system 1 includes: a sensor panel 2; and an integrated circuit 3 for controlling the sensor panel 2. The sensor panel 2 includes: M drive lines DL1 through DLM provided in a horizontal direction in parallel to one another so as to be separated from one another at a predetermined interval; L sense lines SL1 through SLL provided in such a direction as to cross the drive lines and in parallel to one another so as to be separated from one another at a predetermined interval; and capacitances Cij (where i=1 to M, and j=1 to L) provided in a matrix of M rows×L columns at respective intersections of the M drive lines DL1 through DLM with the L sense lines SL1 through SLL.

Figure 2:
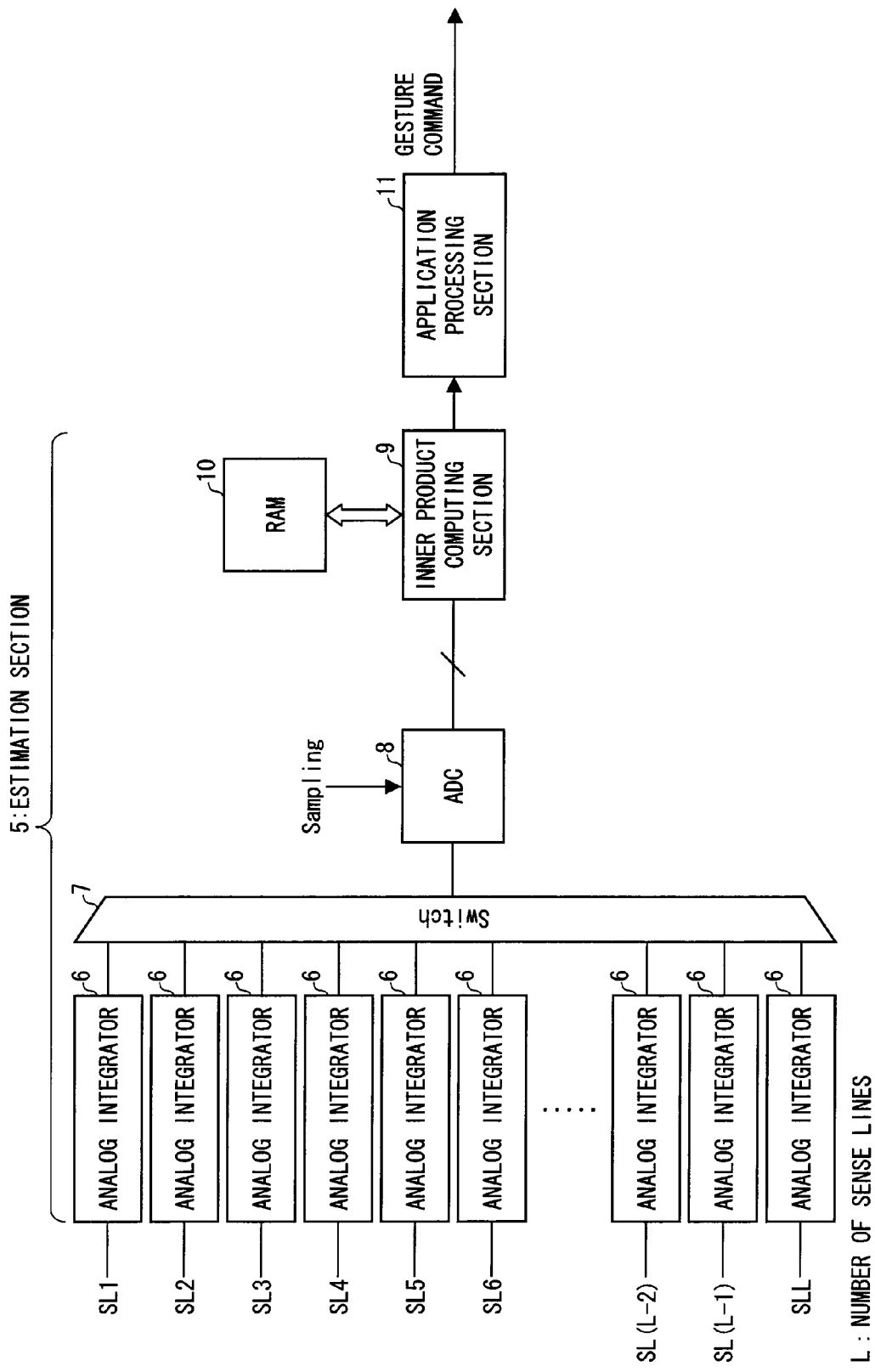
FIG. 2 is a block diagram illustrating a configuration of an estimation section of an integrated circuit included in the touch sensor system.

The integrated circuit 3 includes: a drive section 4 connected to the M drive lines DL1 through DLM; and an estimation section 5. FIG. 2 is a block diagram illustrating a configuration of the estimation section 5 included in the integrated circuit 3.

The estimation section 5 includes: L analog integrators 6 connected to the L sense lines SL1 through SLL, respectively; a switch 7 connected to the L analog integrators 6; an AD converter 8 connected to the switch 7; an inner product computing section 9 connected to the AD converter 8; and a RAM 10 connected to the inner product computing section 9. The analog integrators 6 each include: an operational amplifier with a first input grounded; an integral capacitance Cint provided between an output of the operational amplifier and a second input thereof; a first transistor connected to the second input of the operational amplifier; and a second transistor connected to the second input in parallel to the first transistor.

The integrated circuit 3 further includes an application processing section 11 which is connected to the inner product computing section 9 and which carries out a gesture recognition process (for example, ARM) at 240 Hz. The estimation section 5 thus includes both analog circuits digital circuits.

(Operation of Conventional Touch Sensor System)

The description below deals first with an operation of the conventional touch sensor device disclosed in Patent Literature 1 mentioned above, and then with an operation of the touch sensor system 1 of the present embodiment in detail. The following looks at detection of capacitances Cij (where i=1, ..., M, and j=1, ..., L) formed in a matrix at respective intersections of M drive lines and L sense lines, and specifically at scanning detection in which the individual drive lines are sequentially selected.

Capacitances Cij (j=1, ..., L) connected to a selected drive line are each supplied with a voltage V so as to store an electric charge (signal) Cij×V. Supposing that this signal is read out via a sense line so that a gain G is obtained, a signal to be detected is expressed as follows:

$$G \times Cij \times V \quad \text{(Formula 1)}$$

(Operation of Touch Sensor System of Present Embodiment)

Figure 3:
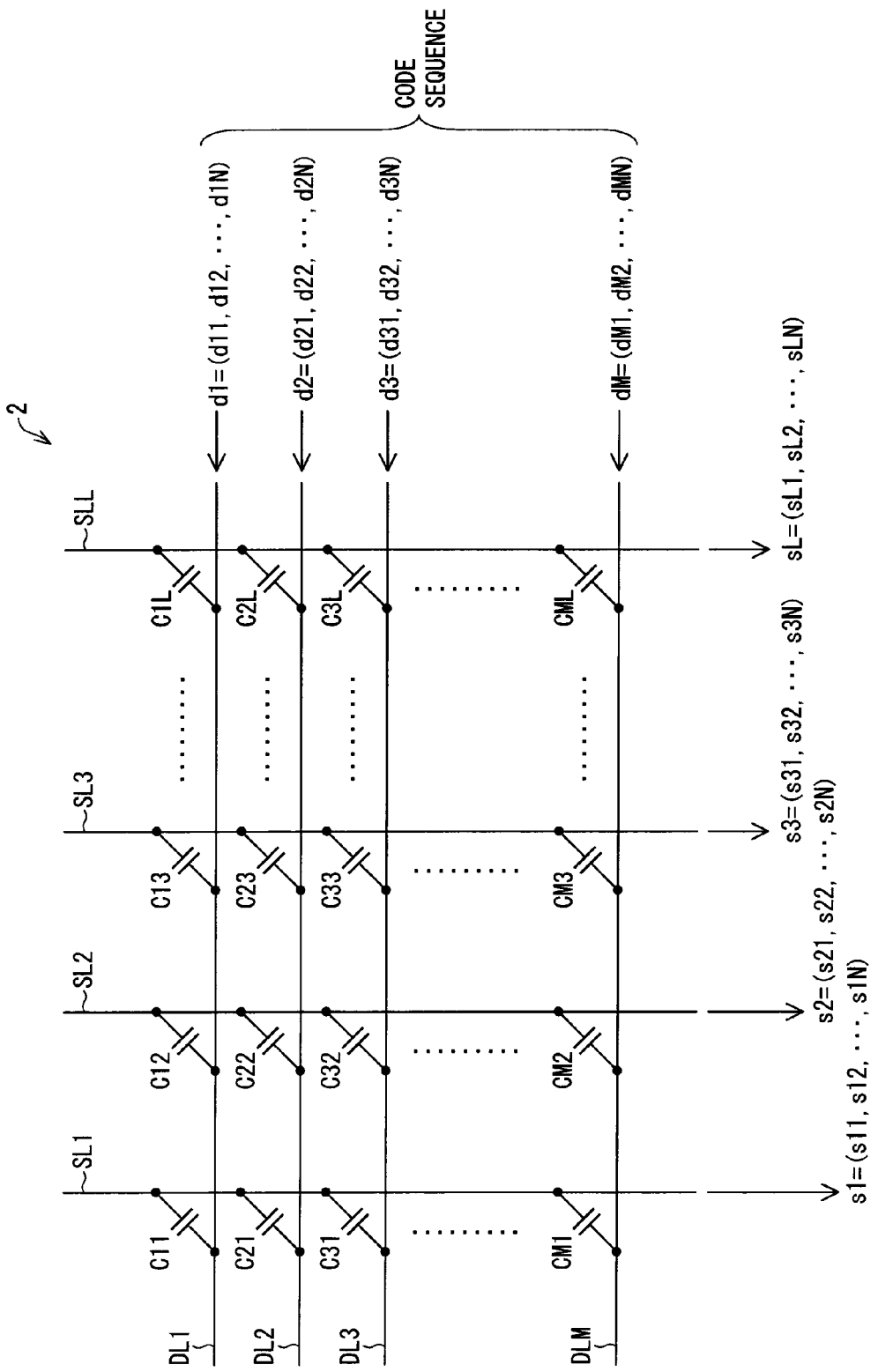
FIG. 3 is a diagram describing a method for driving a sensor panel included in the touch sensor system.

FIG. 3 is a diagram illustrating a method for driving the sensor panel 2 included in the touch sensor system 1. Constituents illustrated in FIG. 3 which are identical to their respective equivalents illustrated and referred to in FIGS. 1 and 2 are each assigned the same reference sign accordingly. Such constituents in FIG. 3 are not described in detail here.

First, the present embodiment of the present invention prepares code sequences di (=di1, di2, ..., diN, where i=1, ..., M). The code sequences di are orthogonal to one another and include +1 and −1. Further, the code sequences di each have a code length N. The orthogonality of the code sequences di (=di1, di2, ..., diN, where i=1, ..., M) each with a code length N means that the code sequences di satisfy the following condition:

$$di \cdot dk = \sum_{j=1}^{N} dij \times dkj$$
$$= N \times \delta ik$$

where
$\delta ik = 1$ if $i = k$
$\delta ik = 0$ if $i \neq k$.

The drive section 4 drives the M drive lines DL1 through DLM in parallel on the basis of the code sequences di so that a voltage +V is applied to each capacitance corresponding to +1 and a voltage −V is applied to each capacitance corresponding to −1. The capacitances Cij (where i=1 to M, and j=1 to L) consequently each store an electric charge (signal) ±Cij·V in accordance with a corresponding element (+1 or −1) in the code sequences.

The analog integrators 6 then each (i) add, via its connection to a corresponding sense line, electric charges stored in capacitances connected to the sense line and thus (ii) read out a signal for its corresponding sense line. The analog integrators 6 consequently obtain output sequence vectors sj (=sj1, sj2, ..., sjN, where j=1, ..., L).

Figure 4:
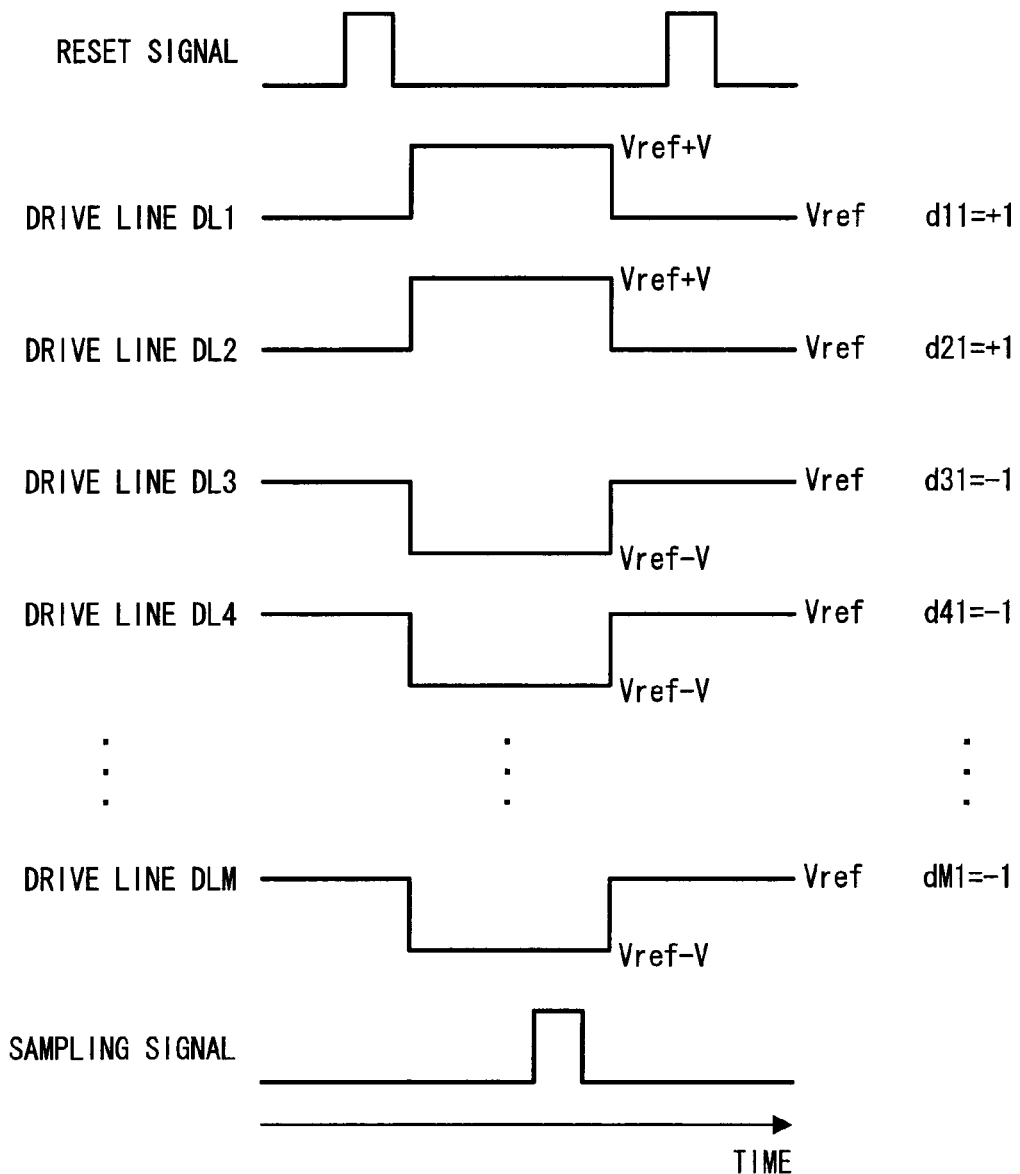
FIG. 4 is a timing chart describing the method for driving the sensor panel.

FIG. 4 is a timing chart illustrating the method for driving the sensor panel 2. First, a reset signal resets (i) the integral capacitances Cint of the respective analog integrators 6 and (ii) the capacitances provided in the sensor panel 2 in a matrix. The term "reset" as used herein means to discharge a capacitance. Next, the drive lines DL1 through DLM are driven in parallel each at Vref+V or Vref−V in accordance with each value (+1 or −1) of d11, d21, d31, ..., dM1 in a code sequence. This causes each corresponding capacitance to store an electric charge ±CV in accordance with a corresponding element ±1 of the code sequence. Then, a corresponding one of the analog integrators 6 (i) adds, via its connection to a corresponding sense line, electric charges stored in the capacitances connected to the sense line and thus (ii) reads out a signal for its corresponding sense line. The analog integrator 6 then outputs a result represented by $$G \times \sum_{k=1}^{M} (Cki \times V \times dki)$$

(in this circuit, G=−1/Cint), which is next subjected to an AD conversion in the AD converter 8 in accordance with a sampling signal.

The above operation produces output sequence vectors sji expressed as $$sji = G \times \sum_{k=1}^{M} (Ckj \times V \times dki)$$

and therefore, $$sj = \sum_{k=1}^{M} (Ckj \times V \times dk).$$

To find an inner product di·sj of a code sequence di and an output sequence vector sj, $$di \cdot sj = di \cdot G \times \sum_{k=1}^{M} (Ckj \times V \times dk) \quad \text{(Formula 2)}$$
$$= G \times \sum_{k=1}^{M} (Ckj \times V \times di \cdot dk)$$
$$= G \times \sum_{k=1}^{M} (Ckj \times V \times N \times \delta ik)$$
$$= G \times Cik \times V \times N$$

where
$\delta ik = 1$ if $i = k$
$\delta ik = 0$ if $i \neq k$

Comparison between Formula 1 and Formula 2 shows that the method of the present embodiment makes it possible to detect a signal which is N times as large as a signal detected by the conventional scanning readout method.

The gain G is 1/Cint in a case where signals are read out via the sense lines with use of the analog integrators 6 illustrated in FIGS. 1 and 2, that is, electric charge integrators each including an operational amplifier provided with an integral capacitance Cint.

The drive section 4 of the integrated circuit 3 thus drives the M drive lines in parallel so that for each of a first capacitance column Cip (where p is not smaller than 1 and not larger than (L−1), and i=1, . . . , M) and a second capacitance column Ciq (where p<q, q is not smaller than 2 and not greater than L, and i=1, . . . , M), voltages +V and −V are applied to capacitances so as to correspond to +1 and −1 of a code sequence, respectively, in accordance with the code sequences di (=di1, di2, . . . , diN, where i=1, . . . , M) which are orthogonal to one another and include elements of +1 and −1 and each of which has a length N. The drive section 4 then causes (i) the first capacitance column to output sFirst (=sp1, sp2, . . . , spN) and (ii) the second capacitance column to outputs sSecond (=sq1, sq2, . . . , sqN).

The outputs sFirst (=sp1, sp2, . . . , spN) from the first capacitance column are each integrated by a corresponding analog integrator 6, whereas the outputs sSecond (=sq1, sq2, . . . , sqN) from the second capacitance column are also each integrated by a corresponding analog integrator 6. The switch 7 sequentially selects one of the analog integrators 6, respectively corresponding to the sense lines SL1 through SLL, so as to supply to the AD converter 8 outputs from each capacitance column which have each been integrated by a corresponding analog integrator 6.

Specifically, the output sp1 is first read out from the first capacitance column to a first analog integrator 6 and integrated by the first analog integrator 6, while simultaneously, the output sq1 is read out from the second capacitance column to a second analog integrator 6 and integrated by the second analog integrator 6. Then, the switch 7 connects to the first analog integrator 6 so as to supply to the ADC 8 the output sp1 read out and integrated as above. The switch 7 then disconnects from the first analog integrator 6 and connects to the second analog integrator 6 so as to supply to the ADC 8 the output sq1 read out and integrated as above. Next, the output sp2 is read out from the first capacitance column to the first analog integrator 6 and integrated by the first analog integrator 6, while simultaneously, the output sq2 is read out from the second capacitance column to the second analog integrator 6 and integrated by the second analog integrator 6. Then, the switch 7 connects to the first analog integrator 6 so as to supply to the ADC 8 the output sp2 read out and integrated as above. The switch 7 then disconnects from the first analog integrator 6 and connects to the second analog integrator 6 so as to supply to the ADC 8 the output sq2 read out and integrated as above. This operation allows the outputs sp1 through spN and the outputs sq1 through sqN to be sequentially supplied to the ADC 8 via the first and second analog integrators 6 and the switch 7. The analog integrators 6 for all the sense lines operate in parallel in accordance with the driving of the drive lines.

The AD converter 8 carries out an AD conversion with respect to the outputs from each capacitance column, the outputs each having been integrated by a corresponding one of the analog integrators 6, and supplies the resulting outputs to the inner product computing section 9.

The inner product computing section 9 estimates, with reference to data stored in the RAM 10, (i) a capacitance value in the first capacitance column, the capacitance value corresponding to a k1-th drive line (where $1 \leq k1 < M$), by computing an inner product of a corresponding output sFirst and a corresponding code sequence di and (ii) a capacitance value in the second capacitance column, the capacitance value corresponding to a k2-th drive line (where k1<k2, and $1 < k1 \leq M$), by computing an inner product of a corresponding output sSecond and a corresponding code sequence di.

The application processing section 11 carries out a gesture recognition process on the basis of capacitance values of the capacitances which capacitance values have been estimated by the inner product computing section 9, and thus generates a gesture command.

(Specific Examples of Code Sequences)

Figure 5:
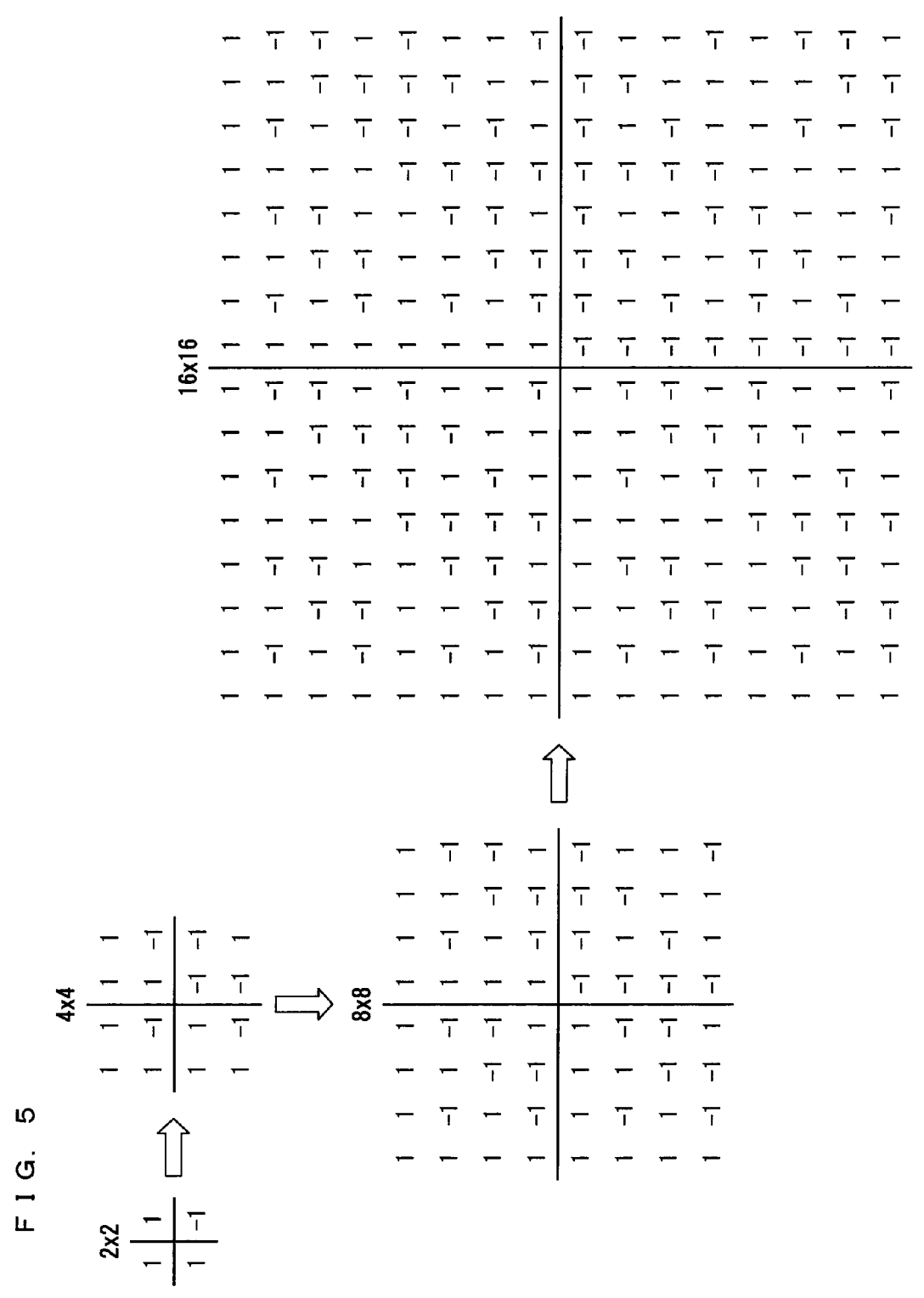

FIG. 5 is a diagram illustrating a first specific example of orthogonal code sequences as an input to the sensor panel 2. The orthogonal code sequences di each with a length N can be created specifically as described below, for example.

An Hadamard matrix, which is a typical example of orthogonal code sequences, is created by Sylvester method illustrated in FIG. 5. The method first creates a building block of 2 rows×2 columns as a basic structure. The building block includes four bits, among which an upper right one, an upper left one, and a lower left one are identical to one another, whereas a lower right one is an inverse of the above bits.

The method then combines four blocks of the above 2×2 basic structure at upper right, upper left, lower right, and lower left locations so as to create codes in a bit arrangement of 4 rows×4 columns. The method also inverts bits in the lower right block as in the above creation of a 2×2 building block. Next, the method similarly creates codes in a bit arrangement of 8 rows×8 columns, and then creates codes in a bit arrangement of 16 rows×16 columns. These matrices each satisfy the above-mentioned definition of being "orthogonal" in the present invention.

In a case where, for example, the sensor panel 2 of the present embodiment includes 16 drive lines, the present embodiment can use, as the orthogonal code sequences, codes in a bit arrangement of 16 rows×16 columns illustrated in FIG. 5. An Hadamard matrix is a square matrix which includes elements each being 1 or −1 and which includes rows orthogonal to one another. In other words, any two rows in an Hadamard matrix represent vectors perpendicular to each other.

The orthogonal code sequences of the present embodiment can be any M-row matrix taken from an N-dimensional Hadamard matrix (where $M \leq N$). As described below, an Hadamard matrix created by a method other than Sylvester method can alternatively be used in the present invention.

FIG. 6 is a diagram illustrating a second specific example of the orthogonal code sequences. FIG. 7 is a diagram illustrating a third specific example of the orthogonal code sequences. While any N-dimensional Hadamard matrix created by Sylvester method can be expressed by a power of N=2, it is assumed that an Hadamard matrix can be created if N is a multiple of 4. For example, FIG. 6 illustrates an Hadamard matrix in which N=12, whereas FIG. 7 illustrates an Hadamard matrix in which N=20. These Hadamard matrices created by a method other than Sylvester method can alternatively be used as the orthogonal code sequences of the present embodiment.

(How Inner Product Is Computed)

An inner product matrix $C'ij=di \cdot sj$ is computed through steps described below.

(1) The integrated circuit 3 resets an inner product matrix stored in the RAM 10 (see FIG. 2) of the estimation section 5 to C'ij=0.

(2) The drive section 4 drives an i-th drive line DLi (where i=1, . . . , M) at a voltage V×dik in parallel at a time tk (where k is one of 1, . . . , N) so as to supply each connected capacitance with an electric charge Cij×V×dik.

(3) The integrated circuit 3 connects the analog integrators 6 to their corresponding sense lines j (where j=1, . . . , L) so that the analog integrators 6 each read out an output voltage sjk from a corresponding one of the capacitances which have been charged at the time tk. The switch 7 then sequentially supplies the L output voltages sjk for the time tk to the AD converter 8 for AD conversion. The L output voltages sjk have been read out by the L respective analog integrators 6 provided so as to correspond to the L sense lines. The AD converter 8 carries out an AD conversion with respect to the output voltages sjk for the time tk, and then supplies them to the inner product computing section 9.

The output voltages sjk for the time tk thus supplied to the inner product computing section 9 are expressed as follows:

$$sjk = \sum_{i=1}^{M} (Cij \times V \times dik / Cint).$$

(4) The inner product computing section 9 carries out addition or subtraction with respect to C'ij in accordance with (i) the L respective output voltages sjk outputted from the AD converter 8 and (ii) code sequences dik stored in the RAM 10. Specifically, the inner product computing section 9 carries out addition if a code sequence dik in question is 1, whereas it carries out subtraction if a code sequence dik in question is −1. The inner product computing section 9 then updates values of C'ij on the basis of results of the addition or subtraction:

C'ij←C'ij+dik×sjk (5) The above procedure is repeated N times so as to correspond to the length of each code sequence while a value of the time is increased in increments (that is, tk+1). The process then returns to the step (1).

Completing the above steps causes C'ij to have values equal to results of the inner product computation.

The sensor panel 2 of the present embodiment, as described above, includes M drive lines and L sense lines, and has a length N for each code sequence. In a case where, for example, the sensor panel 2 is used in a 4-inch class mobile data terminal or the like, the sensor panel 2 will have a pitch of approximately 3 mm if M=16 and L=32. In a case where, for example, the sensor panel 2 is used in an electronic device including a 20-inch class screen, the sensor panel 2 will have a pitch of approximately 6 mm if M=48 and L=80. The length N of the code sequences has a very large degree of freedom, for example, N=64 to 512.

(Difference in Concept of Driving between Present Invention and Conventional Art)

The capacitance detecting circuit disclosed in Patent Literature 2 mentioned above also (i) drives drive lines on the basis of a code sequence, (ii) outputs measured voltages each obtained by converting into an electric signal a sum total of currents across capacitances, connected to sense lines, at a plurality of respective intersections of each sense line with the driven drive lines, and (iii) carries out, for each sense line, a product-sum operation on the basis of the measured voltages and the code sequence. The capacitance detecting circuit thus finds a voltage value corresponding to each of the capacitances at the respective intersections. This capacitance detecting circuit, however, differs as below from the present embodiment in concept of driving the drive lines.

To simplify an explanation, the following description deals with an example case in which four capacitances (C1, C2, C3, and C4) are formed between a single sense line and four drive lines. Assuming that driving signals (code sequences) for the four drive lines are 1, 1, −1, and −1 (1, 1, 0, and 0 in Patent Literature 2), the present embodiment drives all the drive lines for each driving operation and thus produces an integral output corresponding to C1+C2−C3−C4    (Formula 3), whereas the capacitance detecting circuit disclosed in Patent Literature 2 drives only drive lines corresponding to "1" and thus produces an integral output corresponding to C1+C2    (Formula 4).

Comparison between Formula 3 of the present embodiment and Formula 4 of Patent Literature 2 shows that the integral output produced in the present embodiment has a larger amount of information than that of Patent Literature 2.

Assuming that $Ci = C + \Delta Ci$ where ΔCi represents a change in capacitance (ΔCi is normally approximately 10% of C), $$\begin{aligned}(\text{Formula 3}) &= C1 + C2 - C3 - C4 \\&= \Delta C1 + \Delta C2 - \Delta C3 - \Delta C4 \\&\approx 0.2 \times C,\end{aligned}$$ (Formula 5)

and $$(\text{Formula 4}) = 2 \times C + \Delta C1 + \Delta C2 \approx 2 \times C,$$ (Formula 6)

where the symbol "≈" means "nearly equal."

Since ΔCi is approximately 10% of C in a touch sensor panel or the like, Formula 6 yields a value which is approximately 10 times as large as a value of Formula 5. This indicates that an integrating circuit that satisfies Formula 6 of Patent Literature 2 is unfortunately (i) required to set a gain which is approximately 1/10 of that of an integrating circuit of the present embodiment which integrating circuit satisfies Formula 5, and is thus (ii) lower in S/N ratio than the integrating circuit of the present embodiment. This difference in S/N ratio further increases with an increase in the number M of the drive lines.

The present embodiment, which drives all the drive lines in parallel for each driving operation, differs from the capacitance detecting circuit disclosed in Patent Literature 2, which switches between driving a first drive line group (C1 and C2) and driving a second drive line group (C3 and C4) on the basis of a code sequence so as to cancel an offset error in a measured voltage. In the present embodiment, an offset due to feedthrough in a reset switch can be measured on the basis of an output obtained from the AD converter 8 in a state where no signal is being inputted to a drive line (that is, the drive line is driven at a voltage Vref). Subtracting a measured offset value in a digital circuit cancels an offset error.

(Difference in Positive and Negative Operation between Present Invention and Conventional Art)

The present embodiment calculates a value of Formula 3 at once by driving the M drive lines in parallel in accordance with values in a code sequence, that is, by driving the M drive lines so that voltages +V and −V are applied to the capacitances so as to correspond to +1 and −1, respectively. The capacitance detecting circuit disclosed in Patent Literature 2, in contrast, first calculates C1+C2 of Formula 4 and then calculates C3+C4 thereof. The capacitance detecting circuit of Patent Literature 2 thus carries out a two-stage operation and is less effective in simultaneously achieving a high speed operation and power consumption reduction.

The present embodiment further differs from the capacitance detecting circuit of Patent Literature 2 in that the present embodiment drives the drive lines so that a voltage −V is applied so as to correspond to a value of −1 in a code sequence, whereas the capacitance detecting circuit of Patent Literature 2 merely drives the drive lines at a voltage +V and thus lacks a concept of driving the drive lines at a voltage −V.

(Difference in Concept of Orthogonality between Present Invention and Conventional Art)

As described above, the present invention states as a definition that the orthogonality of the code sequences di (=di1, di2, . . . , diN, where i=1, . . . , M) each with a code length N means that the code sequences di satisfy the following condition:

$$di \cdot dk = \sum_{j=1}^{N} dij \times dkj$$
$$= N \times \delta ik$$

where
$\delta ik = 1$ if $i = k$
$\delta ik = 0$ if $i \neq k$.

Patent Literatures 2 through 5 each disclose code sequences which they state are orthogonal. However, none of their specifications clearly defines the "orthogonality." Patent Literature 2, for example, discloses in FIG. 19 a matrix of 15 rows×15 columns and states that it uses the matrix of 15 rows×15 columns as orthogonal codes. The matrix of 15 rows×15 columns, however, does not satisfy the above definition of the present invention, and thus does not correspond to the orthogonal code sequences of the present invention. While accurately detecting capacitances by computing an inner product requires orthogonality of the code sequences, the capacitance detecting circuit of Patent Literature 2 reads out values by a method other than the method based on the orthogonal code sequences of the present invention, and the values thus read out are consequently partially erroneous.

(Another Configuration of Estimation Section 5)

The present embodiment describes an example arrangement including (i) analog integrators 6 which are provided so as to correspond to L respective sense lines, (ii) a switch 7 which sequentially selects one of the analog integrators 6, (iii) a single AD converter 8, and (iv) a single inner product computing section 9. The present invention is, however, not limited to this arrangement. The present invention can alternatively include a single analog integrator 6 so that the single analog integrator 6 sequentially selects an input to read out a signal for each sense line.

The present invention can further alternatively include (i) AD converters 8 provided so as to correspond to the respective sense lines and the respective analog integrators 6 and (ii) a switch 7 provided between the AD converters 8 and the inner product computing section 9.

(Variation of Present Embodiment)

The present embodiment describes an example case of detecting capacitance values of respective capacitances formed between drive lines and sense lines. The present invention is, however, not limited to this. The present invention is also applicable in, for example, an arrangement for estimating values of respective linear devices formed between drive lines and sense lines. The present invention is further applicable in an arrangement for estimating a coefficient Ck corresponding to a k-th input xk (k=1, . . . , M) of a system which includes M inputs xk and has a linear input/output.

Furthermore, (i) the touch sensor system 1 of the present embodiment and (ii) a display panel placed over the sensor panel 2 of the touch sensor system 1 can be combined with each other so as to constitute an electronic device. Alternatively, (i) the touch sensor system 1 and (ii) a display panel including the sensor panel 2 and having a function of the sensor panel 2 included in the touch sensor system 1 can be combined with each other so as to constitute an electronic device.

(Embodiment 2)

(Method for Driving Sensor Panel at Two Voltages)

Figure 8:
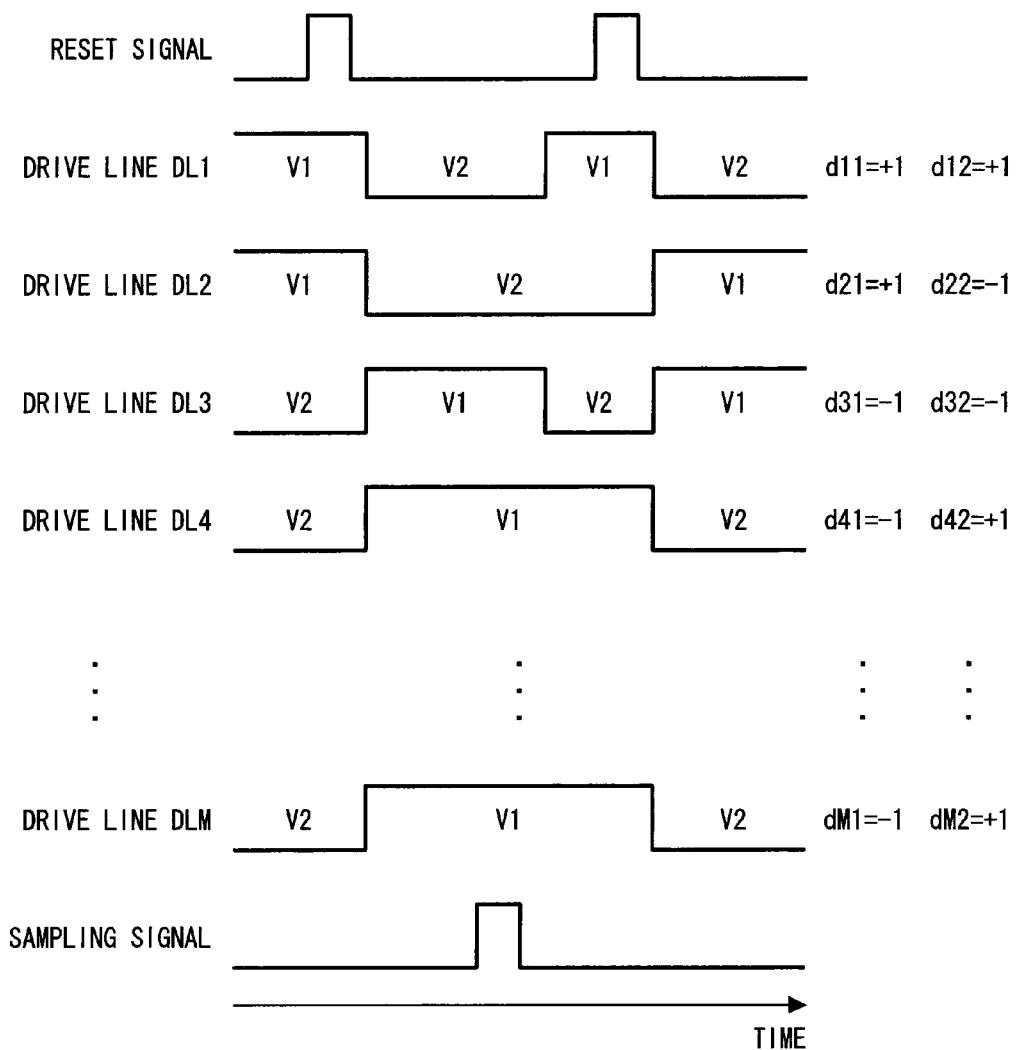
FIG. 8 is a timing chart illustrating a method for driving a sensor panel included in a touch sensor system of Embodiment 2.

FIG. 8 is a first timing chart illustrating a method for driving a sensor panel 2 included in a touch sensor system 1 of Embodiment 2.

The method described in Embodiment 1 above with reference to FIG. 4 for driving the sensor panel 2 drives the sensor panel 2 at three voltages, namely Vref, Vref+V, and Vref−V. The driving method of Embodiment 2, in contrast, drives the sensor panel 2 at two voltages V1 and V2.

Specifically, for a value of +1 in a code sequence, the method drives a corresponding drive line at (i) a voltage V1 when a corresponding one of the analog integrators 6 (see FIG. 1) is reset and at (ii) a voltage V2 when an output is sampled from a capacitance connected to a corresponding sense line. Further, for a value of −1 in a code sequence, the method drives a corresponding drive line at (i) the voltage V2 when a corresponding one of the analog integrators 6 is reset and at (ii) the voltage V1 when an output is sampled from a capacitance connected to a corresponding sense line.

More specifically, in an example illustrated in FIG. 8, the drive line DL1, which corresponds to a code sequence having elements d11=+1 and d12=+1, is driven at (i) the voltage V1 when the analog integrators 6 are reset, (ii) the voltage V2 when outputs are sampled, (iii) the voltage V1 when the analog integrators 6 are reset next, and (iv) the voltage V2 when outputs are sampled next. The drive line DL2, which corresponds to a code sequence having elements d21=+1 and d22=−1, is driven at (i) the voltage V1 when the analog integrators 6 are reset, (ii) the voltage V2 when outputs are sampled, (iii) the voltage V2 when the analog integrators 6 are reset next, and (iv) the voltage V1 when outputs are sampled next.

The drive line DL3, which corresponds to a code sequence having elements d31=−1 and d32=−1, is driven at (i) the voltage V2 when the analog integrators 6 are reset, (ii) the voltage V1 when outputs are sampled, (iii) the voltage V2 when the analog integrators 6 are reset next, and (iv) the voltage V1 when outputs are sampled next. The drive line DL4, which corresponds to a code sequence having elements d41=−1 and d42=+1, is driven at (i) the voltage V2 when the analog integrators 6 are reset, (ii) the voltage V1 when outputs are sampled, (iii) the voltage V1 when the analog integrators 6 are reset next, and (iv) the voltage V2 when outputs are sampled next. The drive line DLM, which corresponds to a code sequence having elements dM1=−1 and dM2=+1, is driven at (i) the voltage V2 when the analog integrators 6 are reset, (ii) the voltage V1 when outputs are sampled, (iii) the voltage V1 when the analog integrators 6 are reset next, and (iv) the voltage V2 when outputs are sampled next.

Assuming that V1=Vdd and V2=Vss, an output is expressed as $$(Cf/Cint) \times (V1-V2) = (Cf/Cint) \times (Vdd-Vss).$$

In the method described in Embodiment 1 above with reference to FIG. 4 for driving the sensor panel 2, if Vref=(Vdd−Vss)/2, $$V=(Vdd-Vss)/2$$

since Vdd=Vref+V and Vss=Vref−V. This V is half an output in the example illustrated in FIG. 8. The driving method of Embodiment 2 illustrated in FIG. 8 thus (i) achieves a signal intensity which is twice as large as a signal intensity achieved by the driving method of Embodiment 1 illustrated in FIG. 4, and consequently (ii) allows the capacitances to each store an electric charge which is twice as large accordingly.

(Reading Out Offset)

Figure 9:
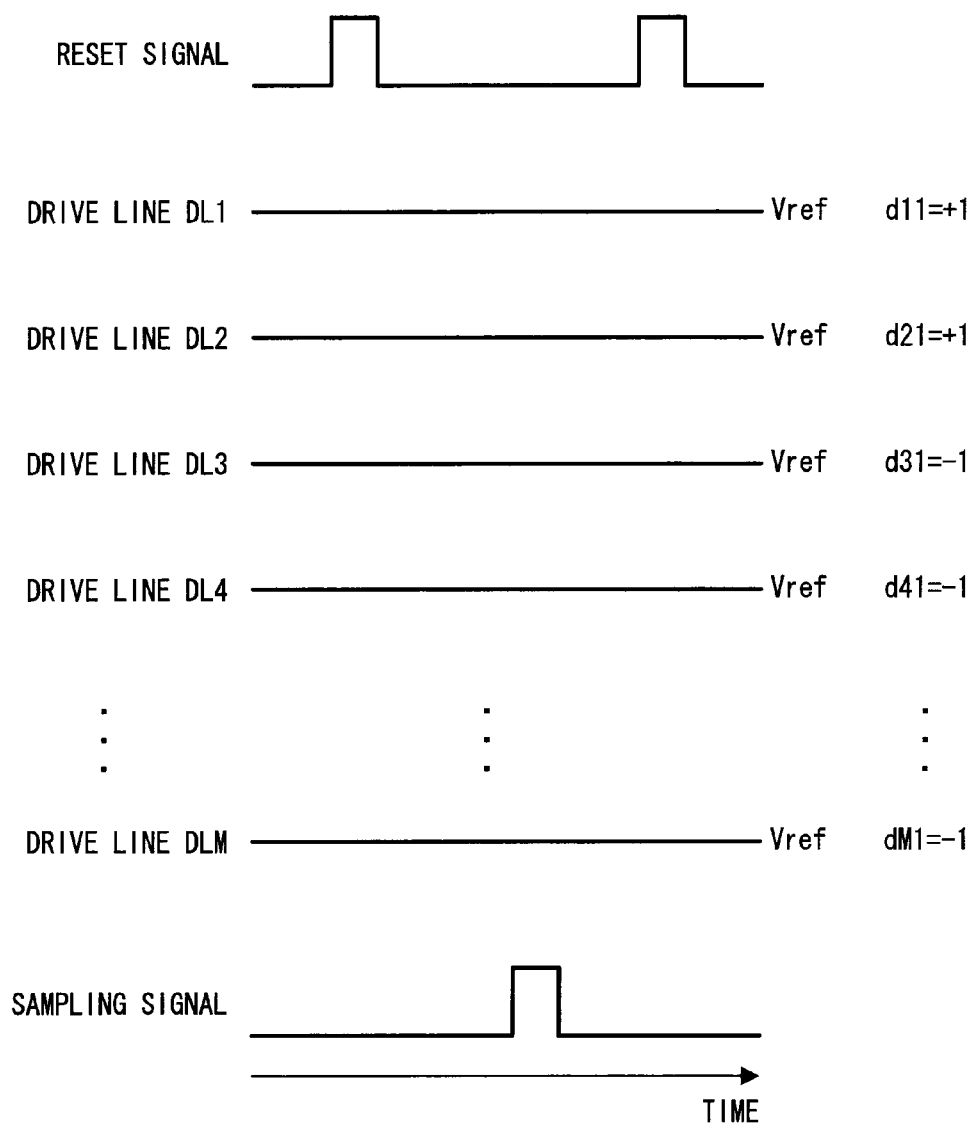
FIG. 9 is another timing chart illustrating the method for driving the sensor panel included in the touch sensor system of Embodiment 2.

FIG. 9 is a second timing chart illustrating a method for driving the sensor panel 2 included in the touch sensor system 1 of Embodiment 2.

The method drives the drive lines DL1 through DLM as illustrated in FIG. 9 before it drives the drive lines DL1 through DLM in parallel illustrated in FIG. 4 or 8. Specifically, the method drives the drive lines DL1 through DLM at a constant voltage Vref both when the analog integrators 6 are reset and when outputs are sampled, and thus supplies no signals to the drive lines. The method in this state reads out offset output values from the respective analog integrators 6 (see FIGS. 1 and 2). The ADC 8 then carries out an AD conversion with respect to the offset output values read out from the analog integrators 6 as above. The inner product computing section 9 next measures the offset output values which have been subjected to an AD conversion in the ADC 8. The offset output values thus measured are each stored in the RAM 10 in association with a corresponding one of the sense lines SL1 through SLL.

(Offset Compensation Method)

The method next drives the drive lines DL1 through DLM in parallel as illustrated in FIG. 4 or 8, and causes each capacitance column to supply outputs to a corresponding analog integrator 6. The ADC 8 then carries out an AD conversion with respect to the outputs from the capacitance columns which outputs have been received by the analog integrators 6, and thus supplies the resulting outputs to the inner product computing section 9. The inner product computing section 9 next subtracts, for the respective sense lines SL1 through SLL, the offset output values stored in the RAM 10 from the outputs from the capacitance columns which outputs have been supplied from the ADC 8. This cancels an offset due to feedthrough in a reset switch in each analog integrator 6.

The method can alternatively (i) repeat, a plurality of times, a procedure of: driving the drive lines DL1 through DLM at a constant voltage Vref both when the analog integrators 6 are reset and when outputs are sampled; reading out offset output values from the respective analog integrators 6; causing the ADC 8 to carry out an AD conversion with respect to the offset output values read out as above; and causing the inner product computing section 9 to measure the resulting offset output values, so as to measure a plurality of sets of offset output values, and (ii) finding averages of the offset output values so as to store in the RAM 10 the average offset output values from which noise components included in the offset have been removed. The above plurality of times can, for example, be set to 16 times for 60 Hz or 100 times for 240 Hz.

(Embodiment 3)

(Switching Gains of Analog Integrators)

Figure 10:
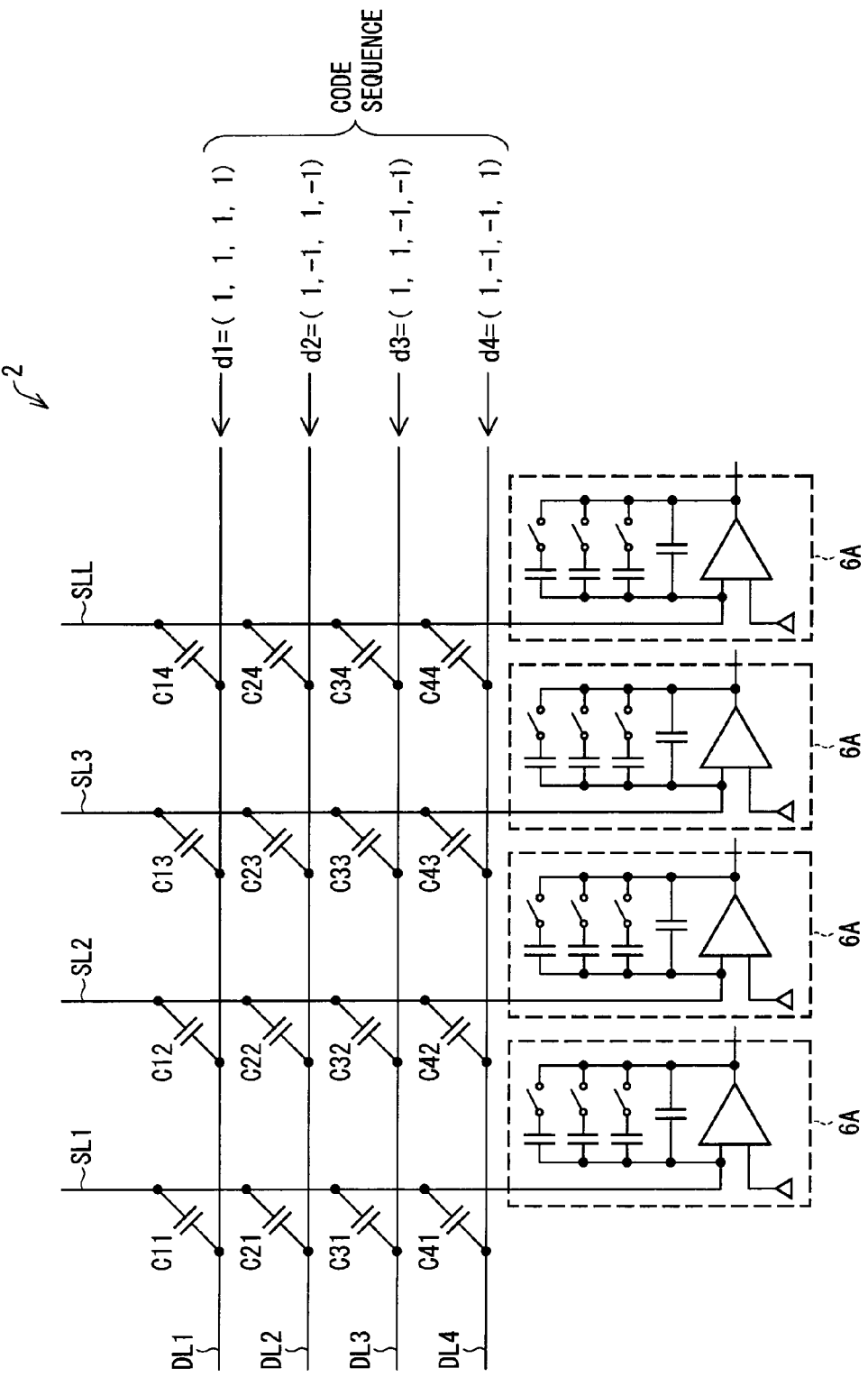
FIG. 10 is a diagram illustrating a method for driving a sensor panel of Embodiment 3.

FIG. 10 is a diagram illustrating a method for driving a sensor panel 2 of Embodiment 3. Constituents of the present embodiment which are identical to their respective equivalents in Embodiment 1 are each assigned the same reference sign accordingly. Such constituents of the present embodiment are not described in detail here.

The present embodiment deals with an example which involves (i) a sensor panel 2 including four drive lines DL1 through DL4 and four sense lines SL1 through SL4 and (ii) a code sequence based on a four-dimensional Hadamard matrix created by Sylvester method.

The present embodiment includes analog integrators 6A. The analog integrators 6A each include: an operational amplifier with a first input connected to a reference voltage Vref; an integral capacitance Cint provided between an output of the operational amplifier and a second input thereof; three other integral capacitances connected to the integral capacitance in parallel; and three switches each provided between one of the three other integral capacitances and the output of the operational amplifier.

A code sequence based on a four-dimensional Hadamard matrix created by Sylvester method includes elements such that a sum total of elements along a column direction is "4" for the first column and "0" for each of the second to fourth columns. Thus, a value obtained by adding outputs from a capacitance column is significantly greater when the drive lines are driven on the basis of the elements in the first column of the code sequence than when the drive lines are driven on the basis of the elements in one of the second to fourth columns of the code sequence. The value may exceed a capacity of a corresponding analog integrator 6A and thus saturate the analog integrator 6A.

In view of this, when the drive lines are driven on the basis of a column having a sum total of elements present in the code sequence along the column direction which sum total is so large as to saturate a corresponding analog integrator 6A, the switches included in the corresponding analog integrator 6A are appropriately turned on so as to prevent saturation of the analog integrator 6A.

An Hadamard matrix created by Sylvester method invariably includes a first column having elements each being +1. An Hadamard matrix thus has a sum total of elements in the first column which sum total is significantly greater than that in any other column, and may thus saturate a corresponding analog integrator 6A. It is, however, possible to prevent such saturation of an analog integrator 6A by turning on the switches in the analog integrator 6A as above so as to switch a gain of the analog integrator 6A.

As described above, Embodiment 3 switches a gain of each analog integrator 6A in accordance with an absolute value of a sum total of corresponding elements present in the code sequence along the column direction. As such, it is possible to prevent saturation of the analog integrators 6A.

(Compensation of Gain Switching for Analog Integrator by Gain Switching of Inner Product Computing Section)

The inner product computing section 9 estimates capacitance values in a capacitance column, the capacitance values corresponding to the respective drive lines, by computing an inner product of (i) a code sequence and (ii) digital values each obtained by an AD conversion, by the ADC 8, of outputs from the capacitance column which outputs have been supplied to a corresponding one of the analog integrators 6A that can switch their respective gains. The inner product computing section 9 switches weighting for each of the digital values in accordance with the absolute value of a sum total of corresponding elements present in the code sequence along the column direction. This makes equal, between columns of the code sequence, a product of (i) the gain of an analog integrator 6A and (ii) the gain obtained by weighting the digital value.

(Embodiment 4)

(Division for Driving Drive Lines a Plurality of Times and Computing Inner Products)

(a) and (b) of FIG. 11 are each a diagram illustrating a code sequence for use in driving a sensor panel 2 of Embodiment 4.

(a) of FIG. 11 illustrates a code sequence based on a four-dimensional Hadamard matrix created by Sylvester method. The code sequence is similar to the code sequence of FIG. 10 in that a sum total of elements along the column direction is "4" for the first column and "0" for each of the second to fourth columns. Thus, a value of a sum total of outputs obtained from a capacitance column is significantly greater when the drive lines are driven on the basis of the elements in the first column of the code sequence than when the drive lines are driven on the basis of the elements in one of the second to fourth columns of the code sequence. The value may exceed a capacity of a corresponding analog integrator 6A and thus saturate the analog integrator 6A.

In view of this, the present embodiment divides, as illustrated in (b) of FIG. 11, the first column (1, 1, 1, 1) of the code sequence into two columns: one column represented by (1, 1, 0, 0) and the other column represented by (0, 0, 1, 1). This arrangement (i) increases the number of driving operations for the four drive lines from 4 times to 5 times and (ii) divides the sum total "4" of elements in the column direction into "2" and "2." The above arrangement thus reduces a maximum sum total of elements in the column direction from "4" to "2," and thus prevents saturation of the analog integrators.

Embodiment 4 illustrates an example code sequence based on a four-dimensional Hadamard matrix created by Sylvester method. The present invention is, however, not limited to this. The present invention is alternatively applicable in a code sequence based on a $2^n$-dimensional Hadamard matrix other than a four-dimensional Hadamard matrix. The present invention is also applicable in a code sequence based on an Hadamard matrix of any dimension which Hadamard matrix is created by a method other than Sylvester method.

(Embodiment 5)

(Triangular Mountain Shaped Driving Method)

FIG. 12 is a diagram illustrating a code sequence for use in driving a sensor panel 2 of Embodiment 5.

In the sensor panel 2 of Embodiment 5, M drive lines are driven in parallel for each capacitance column formed between the M drive lines and L sense lines. The M drive lines are driven as such on the basis of code sequences which are orthogonal to one another and include elements each being +1 or −1 and each of which has a code length N>M. The code sequences correspond to respective rows of a $2^n$-dimensional Hadamard matrix (where M<$2^n$) created by Sylvester method. FIG. 12 illustrates an example of a code sequence of 13 rows×16 columns which is based on a 16-dimensional Hadamard matrix and which corresponds to M drive lines (where M=13).

FIG. 13 is a graph illustrating a method for driving the sensor panel 2. The graph has (i) a horizontal axis representing a location, along the column direction, in the Hadamard matrix (where N=16) illustrated in FIG. 12 and (ii) a vertical axis representing an absolute value of a sum total of elements present in the Hadamard matrix (where N=16) along the column direction.

In the Hadamard matrix where N=16, elements in the first column are each "1." Thus, a relation between (i) a location along the column direction (horizontal axis) and (ii) an absolute value of a sum total of elements along the column direction (vertical axis) is represented by a line L1, which shows a linear, monotone increase.

In the Hadamard matrix where N=16, the 9th column (that is, the $(2^{(4-1)}+1)$th column) includes "1" from the 1st row through to the 8th row and "−1" from the 9th row through to the 16th row. Thus, the above relation for the 9th column is represented by a line L2, which shows a linear, monotone increase and then a linear, monotone decrease, thus forming a triangular mountain shape with a base length of 16 and a height of 8.

In the Hadamard matrix where N=16, the 5th column (that is, the $(2^{4-1}-2^{4-2+1})$-th column) includes (i) "1" from the 1st row through to the 4th row, (ii) "−1" from the 5th row through to the 8th row, (iii) "1" from the 9th row through to the 12th row, and (iv) "−1" from the 13th row through to the 16th row. Thus, the above relation for the 5th column is represented by a line L3, which forms two triangular mountain shapes each with a base length of 8 and a height of 4. Further, the 13th column (that is, the $(2^{4-1}+2^{4-2}+1)$-th column) includes (i) "1" from the 1st row through to the 4th row, (ii) "−1" from the 5th row through to the 8th row, (iii) "−1" from the 9th row through to the 12th row, and (iv) "1" from the 13th row through to the 16th row. Thus, the above relation for the 13th column is also represented by the line L3, which forms two triangular mountain shapes.

The 3rd column, the 7 column, the 11th column, and the 15th column are each represented by a line L4, which forms four triangular mountain shapes each with a base length of 4 and a height of 2. The 2nd column, the 4th column, the 6th column, the 8th column, the 10th column, the 12th column, the 14th column, and the 16th column are each represented by a line L5, which forms eight triangular mountain shapes each with a base length of 2 and a height of 1.

The description below supposes that the above absolute value of a sum total of elements present in the code sequence along the column direction has a threshold Num, above which a corresponding analog integrator 6 (see FIG. 1) is saturated. In the examples illustrated in FIGS. 12 and 13, Num=3, and the number of drive lines is 13 (M=13).

As illustrated in FIG. 13, the absolute value does not exceed the threshold Num=3 in any column corresponding to the line L5 (that is, the 2nd column, the 4th column, the 6th column, the 8th column, the 10th column, the 12th column, the 14th column, and the 16th column) or any column corresponding to the line L4 (that is, the 3rd column, the 7 column, the 11 column, and the 15 column). Simultaneously driving the M (=13) drive lines thus does not saturate analog integrators 6 corresponding to the above columns.

The 1st column corresponding to the line L1 exceeds the threshold Num=3. The 1st column is thus divided in driving on the basis of the threshold Num=3 such that four sets each including three drive lines are driven sequentially from the 1st drive line, and the drive line DL13 is then driven. This prevents saturation of the analog integrators 6.

In general terms, the above driving is carried out such that [M/Num] sets each including NuM drive lines are driven sequentially from the 1st drive line through to the Num×[M/Num]-th drive line, and drive lines corresponding to a remainder of the (M/Num) are then driven in parallel. In the above description, [x] represents the integer part of x, which also applies in the description below.

The 9th column corresponding to the line L2 exceeds the threshold Num=3. For the 9th column corresponding to the line L2, the 2nd drive line through the 13th drive line are first driven in parallel in accordance with their respective corresponding elements in the code sequence, and the 1st drive line is then driven.

In general terms, the above driving is carried out such that a drive line on a row based on the $(2^{n-1}-(M-2^{n-1}))$-th row (=$(2^n-M)$-th row) through a drive line on the M-th row are first driven in parallel. Next, [row based on the $(2^{n-1}-(M-2^{n-1})-1)$-th row/Num] sets each including NuM drive lines are driven sequentially from the 1st drive line through to the drive line on the $(2^{n-1}-(M-2^{n-1}))$-th row (=$(2^n-M)$-th row). Then, drive lines other than the (row based on the $(2^{n-1}-(M-2^{n-1})-1)$-th row/Num) sets are driven in parallel.

In the example of Embodiment 5, where n=4 and M=13, the $(2^{n-1}-(M-2^{n-1}))$-th row=the 3rd row. Even in a case where the 3rd drive line through the 13th drive line are driven in parallel, a sum total of corresponding elements present in the code sequence along the column direction is +1, which is 2 less than the threshold Num=3. Thus, even in a case where the 2nd drive line through the 13th drive line are driven in parallel, a sum total of corresponding elements present in the code sequence along the column direction is +2, which is still less than the threshold Num=3. As such, although the $(2^{n-1}-(M-2^{n-1}))$-th row is the 3rd row, the 2nd row is selected as a row based on the $(2^{n-1}-(M-2^{n-1}))$-th row (=the 3rd row) in view of the threshold Num, and the 2nd drive line through the 13th drive line are thus driven in parallel.

The 5th column and the 13th column corresponding to the line L3 each exceed the threshold Num=3. For the 5th column and the 13th column corresponding to the line L3, the 1st drive line through the 8th drive line are first simultaneously driven in parallel. The 10th drive line through the 13th drive line are then driven. The 9th drive line is driven next.

In general terms, the 1st drive line through the $(2^{n-1})$-th drive line are first simultaneously driven in parallel. Next, a drive line on a row based on the $((2^{n-1}+2^{n-2})-(M-(2^{n-1}+2^{n-2})))$-th row through a drive line on the M-th row are driven in parallel. Then, [((row based on $((2^{n-1}+2^{n-2})-(M-(2^{n-1}+2^{n-2}))))-(2^{n-1}+1)$/Num] sets each including NuM drive lines are driven sequentially from the drive line on the $(2^{n-1}+1)$-th row through to the drive line on the ((row based on the $((2^{n-1}+2^{n-2})-(M-(2^{n-1}+2^{n-2}))$-th row))-1)-th row. Next, drive lines other than the (((row based on $((2^{n-1}+2^{n-2})-(M-(2^{n-1}+2^{n-2}))))-(2^{n-1}+1)$/Num) sets are driven in parallel.

In the example of Embodiment 5, where n=4 and M=13, the $((2^{n-1}+2^{n-2})-(M-(2^{n-1}+2^{n-2})))$-th row=the 11th row. Even in a case where the 11th drive line through the 13th drive line are driven in parallel, a sum total of corresponding elements present in the code sequence along the column direction is +1, which is 2 less than the threshold Num=3. Thus, even in a case where the 10th drive line through the 13th drive line are driven in parallel, a sum total of corresponding elements present in the code sequence along the column direction is +2, which is still less than the threshold Num=3. As such, although the $((2^{n-1}+2^{n-2})-(M-(2^{n-1}+2^{n-2})))$-th row is the 11th row, the 10th row is selected as a row based on the $((2^{n-1}+2^{n-2})-(M-(2^{n-1}+2^{n-2})))$-th row (=the 11th row) in view of the threshold Num, and the 10th drive line through the 13th drive line are thus driven in parallel.

The following description deals with how the sensor panel 2 is driven in a case where the number of drive lines is 12 or smaller (M≤12). The description below first deals with a case in which 8<M≤12: For each of the line L1 and the line L2, a driving method is identical to a corresponding one described above for the line L1 or the line L2. For the line L3, the drive line on the 1st row through a drive line on the $(2^{n-1})$-th row are first driven simultaneously in parallel. Next, $[(M-(2^{n-1}))/Num]$ sets each including NuM drive lines are driven sequentially from a drive line on the $((2^{n-1})+1)$-th row through to a drive line on the $(2^{n-1})+Num\times[(M-(2^{n-1}))/Num]$-th row. Then, drive lines other than the $((M-(2^{n-1}))/Num)$ sets are driven in parallel.

The description below now deals with a case in which 4<M≤8: For the line L1, a driving method is identical to that described above for the line L1. For the line L2, a driving method is also identical to that described above for the line L1. For the line L3, a driving method is identical to that described above for the line L2 of the case of M (number of drive lines)=13.

The description below deals with a case in which M≤4: For the line L1, a driving method is identical to that described above for the line L1. For each of the line L2 and the line L3 also, a driving method is identical to that described above for the line L1.

The following description deals with how the sensor panel 2 is driven in a case where the threshold Num=1 and M (number of drive lines)=13: For each of the line L1, the line L2, and the line L3, a driving method is identical to a corresponding one described above for the case in which the threshold Num=3. For the line L4, a drive line on the 1st row through a drive line on the $(2^{n-1}+2^{n-2})$-th row are first driven simultaneously in parallel. Next, $[(M-(2^{n-1}+2^{n-2}))/Num]$ sets each including NuM drive lines are driven sequentially from a drive line on the $((2^{n-1}+2^{n-2})+1)$-th row through to a drive line on the $(2^{n-1}+2^{n-2})+Num\times[(M-(2^{n-1}+2^{n-2}))/Num]$-th row. Then, drive lines other than the $((M-(2^{n-1}+2^{n-2}))/Num)$ sets are driven in parallel.

A driving method similar to the driving method described above can simply be employed even in a case where the order of the $2^n$-dimensional Hadamard matrix (where M<$2^n$) is increased to n>4.

Even in a case where the relation between (i) a location in the code sequence along the column direction and (ii) the absolute value of a sum total of corresponding elements along the column direction is not as illustrated in FIG. 13, it is possible to switch rows of the code sequence to carry out the above driving method if such switching allows a $2^n$-dimensional Hadamard matrix (where M<$2^n$) to be created by Sylvester method so as to satisfy the above relation illustrated in FIG. 13.

Embodiments 1 through 5 above each describe an example of driving drive lines in parallel in accordance with orthogonal code sequences. The present invention is, however, not limited to this. The present invention can alternatively drive drive lines in accordance with code sequences based on an M-sequence.

(a) of FIG. 14 is a diagram for explaining code sequences of the above Embodiments which code sequences are based on an M-sequence. The code sequences $d_1=(d_{11}, d_{12}, \ldots$ $d_{1N}$), $d_2=(d_{21}, d_{22}, \ldots d_{2N})$, $\ldots$ $dM=(d_{M1}, d_{M2}, \ldots d_{MN})$ based on an M-sequence (i) serve to drive in parallel a first drive line through an M-th drive line and (ii) each include elements each being 1 or −1. The code sequences $d_1$, $d_2$, $\ldots$ $d_M$ based on an M-sequence, assuming that they are sequences resulting from circularly shifting an M-sequence each having a length N ($=2^n-1$), satisfy a condition defined by Formula 8 in (a) of FIG. 14.

An M-sequence is a type of binary pseudo-random number sequence, and includes only two values, namely 1 and −1 (or 1 and 0). An M-sequence has a cycle having a length represented by $2^n-1$. An M-sequence having a length=$2^3-1$=7 is, for example, "1, −1, −1, 1, 1, 1, −1." An M-sequence having a length=$2^4-1$=15 is, for example, "1, −1, −1, −1, 1, 1, 1, 1, −1, 1, −1, 1, 1, −1, −1."

(b) of FIG. 14 is a diagram illustrating a specific example of code sequences based on an M-sequence. (b) of FIG. 14 illustrates code sequences MCS based on an M-sequence which are code sequences of 13 rows×15 columns. The code sequences MCS include a first row which is an M-sequence having a length=15, that is, "1, −1, −1, −1, 1, 1, 1, 1, −1, 1, −1, 1, 1, −1, −1." The code sequences MCS include a second row which results from circularly shifting the M-sequence on the first row to the left by one element. The code sequences MCS include a third row which results from circularly shifting the M-sequence on the second row to the left by one element. The circular shift continues in the following code sequences. The code sequences MCS thus include a k-th row which results from circularly shifting the M-sequence on the (k−1)-th row to the left by one element (where 2≤k≤13).

(Embodiment 6)
(Electronic Device Including Touch Sensor System)

FIG. 15 is a functional block diagram illustrating a configuration of a mobile telephone 12 including the touch sensor system 1. The mobile telephone (electronic device) 12 includes: a CPU 15; a RAM 17; a ROM 16; a camera 21; a microphone 18; a loud speaker 19; operation keys 20; a display panel 13; a display control circuit 14; and the touch sensor system 1. The above constituents are interconnected via a data bus.

The CPU 15 controls operation of the mobile telephone 12. The CPU 15, for example, executes a program stored in the ROM 16. The operation keys 20 receive an input of an instruction by a user of the mobile telephone 12. The RAM 17 stores, in a volatile manner, data generated by execution of a program by the CPU 15 or data inputted with use of the operation keys 20. The ROM 16 stores data in a nonvolatile manner.

The ROM 16 is a writable, erasable ROM such as EPROM (Erasable Programmable Read-Only Memory) and a flash memory. The mobile telephone 12 can further include an interface (IF; not shown in FIG. 15) for connecting to another electronic device by wire.

The camera 21 photographs an object in response to an operation of the operation keys 20 by the user. Image data of the object thus photographed is stored in the RAM 17 or an external memory (for example, a memory card). The microphone 18 receives a speech input from the user. The mobile telephone 12 digitizes the speech input (analog data), and can transmit the digitized speech input to a communication target (for example, another mobile telephone). The loud speaker 19 outputs, for example, sound based on data such as music data stored in the RAM 17.

The touch sensor system 1 includes a sensor panel 2 and an integrated circuit 3. The CPU 15 controls operation of the touch sensor system 1. The CPU 15, for example, executes a program stored in the ROM 16. The RAM 17 stores, in a volatile manner, data generated by execution of a program by the CPU 15. The ROM 16 stores data in a nonvolatile manner.

The display panel 13 displays, as controlled by the display control circuit 14, an image stored in the ROM 16 or the RAM 17. The display panel 13 either is placed on the sensor panel 2 or contains the sensor panel 2.

The linear device column value estimating method of the present embodiment may preferably be arranged such that the code sequences di ($=di1, di2, \ldots , diN$, where $i=1, \ldots, M$) include elements each of which is either +V or −V.

The above arrangement makes it possible to drive each drive line by applying to it either a voltage +V or a voltage −V.

The capacitance detecting method of the present embodiment may preferably be arranged such that the step (B) includes carrying out, for each parallel driving based on the code sequences di, of addition or subtraction in accordance with a code which addition or subtraction is necessary for the first and second inner product operations.

The above arrangement carries out an inner product operation for each parallel driving. The capacitance detecting method thus not only (i) allows pipeline processing and consequently carries out an operation within a short period of time, but also (ii) reduces an amount of memory necessary to carry out an operation, as compared to an arrangement which carries out an inner product operation for each of N parallel drivings corresponding to the length of the code sequences.

The capacitance detecting method may preferably be arranged such that the step (A) outputs the outputs sFirst from the first capacitance column to a first analog integrator and the outputs sSecond from the second capacitance column to a second analog integrator; and the step (B) carries out (I) the first inner product operation by subjecting the outputs sFirst, which have been outputted to the first analog integrator, to an AD conversion in an AD converter and (II) the second inner product operation by subjecting the outputs sSecond, which have been outputted to the second analog integrator, to an AD conversion in the AD converter.

The above arrangement provides analog integrators in parallel for the respective sense lines, and thus increases a speed of detecting all the capacitances provided in a matrix.

The capacitance detecting method may preferably be arranged such that the step (A) first outputs the outputs sFirst from the first capacitance column to an analog integrator and second outputs the outputs sSecond from the second capacitance column to the analog integrator; and the step (B) carries out (I) the first inner product operation by subjecting the outputs sFirst, which have been outputted to the analog integrator, to an AD conversion in an AD converter and (II) the second inner product operation by subjecting the outputs sSecond, which have been outputted to the analog integrator, to an AD conversion in the AD converter.

The above arrangement allows a single analog integrator to carry out the estimating, and thus makes it possible to detect the capacitances with use of a simpler configuration.

The capacitance detecting method may preferably be arranged such that the step (A) outputs the outputs sFirst from the first capacitance column to a first analog integrator and the outputs sSecond from the second capacitance column to a second analog integrator; and the step (B) carries out (I) the first inner product operation by subjecting the outputs sFirst, which have been outputted to the first analog integrator, to an AD conversion in a first AD converter and (II) the second inner product operation by subjecting the outputs sSecond, which have been outputted to the second analog integrator, to an AD conversion in a second AD converter.

The above arrangement provides both analog integrators and AD converters in parallel for the respective sense lines, and thus further increases the speed of detecting all the capacitances provided in a matrix.

The capacitance detecting method of the present embodiment may preferably be arranged such that the step (B) estimates (a) the first capacitance value on a basis of a third inner product operation of (I) a result obtained by subtracting, from the outputs sFirst, the first offset outputs stored in the memory and (II) the code sequences di and (b) the second capacitance value on a basis of a fourth inner product operation of (I) a result obtained by subtracting, from the outputs sSecond, the second offset outputs stored in the memory and (II) the code sequences di.

The above arrangement makes it possible to cancel an offset caused by an analog integrator.

The capacitance detecting method of the present embodiment may preferably be arranged such that the step (C) (I) repeats a plurality of times an operation of (a) driving, when the analog integrator is reset and when the outputs sFirst and sSecond from the first and second capacitance columns are sampled, the drive lines at the first voltage so that the outputs sFirst and sSecond from the first and second capacitance columns are outputted to the analog integrator and (b) reading out, from the analog integrator, the outputs sFirst and sSecond from the first and second capacitance columns as the first offset outputs and the second offset outputs, respectively, and (II) averages a plurality of sets of the first and second offset outputs read out and then stores in the memory a result of the averaging.

The above arrangement makes it possible to store offset outputs in a memory after reducing a noise component contained in an offset caused by an analog integrator.

The capacitance detecting method of the present embodiment may preferably be arranged such that the step (B) estimates (a) the first capacitance value on a basis of a third inner product operation of (I) a first digital value obtained by an AD conversion of the outputs sFirst and (II) the code sequences di and (b) the second capacitance value on a basis of a fourth inner product operation of (I) a second digital value obtained by an AD conversion of the outputs sSecond and (II) the code sequences di; and the step (B) switches weighting for each of the first and second digital values in accordance with the absolute value of a sum total of corresponding elements present in the code sequences along the column direction.

The above arrangement makes it possible to cause a gain obtained on a path from an analog integrator through to the inner product computing section to be constant for each driving based on the code sequences.

The capacitance detecting method of the present embodiment may preferably be arranged such that a column having an absolute value of a sum total of corresponding elements present in the first code sequences along a column direction which absolute value exceeds a threshold Num for saturation of the analog integrator corresponds to at least one of a first column, a $(2^{n-1}+1)$ column, a $(2^{n-1}+2^{n-2}+1)$ column, and a $(2^{n-1}-2^{n-2}+1)$ column of the $2^n$-dimensional Hadamard matrix.

The above arrangement makes it possible to prevent, with use of a simple algorithm, saturation of an analog integrator in a driving based on a $2^n$-dimensional (where M<$2^n$) Hadamard matrix.

The capacitance detecting method of the present embodiment may preferably be arranged such that where [x] represents an integer part of x, the step (A), in a case where the first column of the $2^n$-dimensional Hadamard matrix exceeds the threshold Num, first (a) sequentially drives [M/Num] sets each including NuM drive lines from a first drive line through to a Num×[M/Num]-th drive line and then (b) drives in parallel drive lines corresponding to a remainder of the (M/Num); the step (A), in a case where the $(2^{n-1}+1)$ column of the Hadamard matrix exceeds the threshold Num, first (a) drives in parallel a drive line on a row based on a $(2^{n-1}-(M-2^{n-1}))$-th row through a drive line on an M-th row, second (b) sequentially drives [row based on a $(2^{n-1}-(M-2^{n-1})-1)$-th row/Num] sets each including NuM drive lines from the drive line on a first row through to a drive line on the row based on a $(2^{n-1}-(M-2^{n-1})-1)$-th row, and third (c) drives in parallel drive lines corresponding to a remainder of the (row based on a $(2^{n-1}-(M-2^{n-1})-1)$-th row/Num); and the step (A), in a case where the $(2^{n-1}+2^{n-2}+1)$ column of the Hadamard matrix exceeds the threshold Num, first (a) simultaneously drives in parallel the drive line on the first row through a drive line on a $(2^{n-1})$-th row, second (b) drives in parallel a drive line on a row based on a $((2^{n-1}+2^{n-2})-(M-(2^{n-1}+2^{n-2})))$-th row through a drive line on the M-th row, third (c) sequentially drives [(row based on $(((2^{n-1}+2^{n-2})-(M-(2^{n-1}+2^{n-2}))))-(2^{n-1}+1)$/Num] sets each including NuM drive lines from a drive line on a $(2^{n-1}+1)$-th row through to the drive line on the row based on the $((2^{n-1}+2^{n-2})-(M-(2^{n-1}+2^{n-2})))$-th row, and fourth (d) drives in parallel drive lines corresponding to a remainder of the ((row based on $(((2^{n-1}+2^{n-2})-(M-(2^{n-1}+2^{n-2}))))-(2^{n-1}+1)$/Num).

The above arrangement makes it possible to prevent, with use of a simple algorithm, saturation of an analog integrator in a driving based on a $2^n$-dimensional (where M<$2^n$) Hadamard matrix.

The capacitance detecting method of the present embodiment may preferably further include: the step of: creating, by switching rows, second code sequences based on the Hadamard matrix, wherein: the step (A) drives the M drive lines in parallel on a basis of the second code sequences.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The present invention is applicable to a method for estimating or detecting a coefficient, a device value, or a capacitance in a linear system configured in a matrix. The present invention is further applicable to an integrated circuit, a touch sensor system, and an electronic device each operating in accordance with the method. The present invention is also applicable to a fingerprint detection system.

REFERENCE SIGNS LIST 1 touch sensor system
2 sensor panel
3 integrated circuit
4 drive section
5 estimation section
6, 6A analog integrator
7 switch 8 AD converter
9 inner product computing section
10 RAM
11 application processing section
12 mobile telephone
13 display panel
14 display control circuit
15 CPU
16 ROM
17 RAM
18 microphone
19 loud speaker
20 operation key
21 camera

The invention claimed is:

1. A linear system coefficient estimating method, comprising the steps of:
(A) (a) inputting, on a basis of M code sequences di (=di1, di2, . . . , diN, where i=1, . . . , M), and M<N) each of which has a length N, M inputs Xk (k=1, . . . , M) to a system which has a linear input and output and to which the M inputs Xk (k=1, . . . , M) are to be inputted, the system being represented by $$F(X1, \ldots, XM) = \sum_{i=1}^{M} (Ci \times Xi),$$

and (b) outputting N outputs s=(s1, s2, . . . , sN)=(F (d11, d21, . . . , dM1), F (d12, d22, . . . , dM2), . . . , F (d1N, d2N, . . . , dMN)); and
(B) estimating, on a basis of an inner product operation of the outputs s and the code sequences di, a coefficient Ck corresponding to a k-th input xk.

2. A linear system coefficient estimating method, comprising the steps of:
(A) (a) inputting, on a basis of M code sequences di (=di1, di2, . . . , diN, where i=1, . . . , M), and M<N) each of which has a length N, M inputs Xk (k=1, . . . , M) to each of a first system and a second system each of which has a linear input and output and to each of which the M inputs Xk (k=1, . . . , M) are to be inputted, the first and second systems being represented by $$F1(X1, \ldots, XM) = \sum_{i=1}^{M} (C1i \times Xi)$$

$$F2(X1, \ldots, XM) = \sum_{i=1}^{M} (C2i \times Xi),$$

and (b) outputting N outputs sFirst=(s11, s12, . . . , s1N)=(F1 (d11, d21, . . . , dM1), F1 (d12, d22, . . . , dM2), . . . , F1 (d1N, d2N, . . . , dMN)) from the first system and N outputs sSecond=(s21, s22, . . . , s2N)=(F2 (d11, d21, . . . , dM1), F2 (d12, d22, . . . , dM2), . . . , F2 (d1N, d2N, . . . , dMN)) from the second system; and
(B) estimating (a) on a basis of a first inner product operation of the outputs sFirst and the code sequences di, a coefficient C1k of the first system which coefficient C1k corresponds to a k1-th input Xk and (b) on a basis of a second inner product operation of the outputs sSecond and the code sequences di, a coefficient C2k of the second system which coefficient C2k corresponds to a k2-th input Xk.

3. A linear device column value estimating method, comprising the steps of:
(A) (a) driving, on a basis of M code sequences di (=di1, di2, . . . , diN, where i=1, . . . , M, and where M<N) each of which has a length N, M drive lines in parallel for each of (I) a first linear device column C1i (i=1, . . . , M) formed between the M drive lines and a first sense line and (II) a second linear device column C2i (i=1, . . . , M) formed between the M drive lines and a second sense line, and thus (b) outputting N outputs sFirst=(s11, s12, . . . , s1N) from the first linear device column and N outputs sSecond=(s21, s22, . . . , s2N) from the second linear device column; and
(B) estimating (a) on a basis of a first inner product operation of the outputs sFirst and the code sequences di, a first linear device value in the first linear device column which first linear device value corresponds to a k1-th drive line and (b) on a basis of a second inner product operation of the outputs sSecond and the code sequences di, a second linear device value in the second linear device column which second linear device value corresponds to a k2-th drive line.

4. The linear device column value estimating method according to claim 3, wherein:
the code sequences di (=di1, di2, . . . , diN, where i=1, . . . , M) include elements each of which is either +V or −V.

5. A capacitance detecting method, comprising the steps of:
(A) (a) driving, on a basis of code sequences di (=di1, di2, . . . , diN, where i=1, . . . , M, and where M<N) each of which has a length N, M drive lines in parallel for each of (I) a first capacitance column C1i (i=1, . . . , M) formed between the M drive lines and a first sense line and (II) a second capacitance column C2i (i=1, . . . , M) formed between the M drive lines and a second sense line, and thus (b) outputting outputs sFirst=(s11, s12, . . . , s1N) from the first capacitance column and outputs sSecond=(s21, s22, . . . , s2N) from the second capacitance column; and
(B) estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line.

6. The capacitance detecting method according to claim 5, wherein:
the step (B) includes carrying out, for each parallel driving based on the code sequences di, of addition or subtraction in accordance with a code which addition or subtraction is necessary for the first and second inner product operations.

7. The capacitance detecting method according to claim 5, wherein:
the step (A) outputs the outputs sFirst from the first capacitance column to a first analog integrator and the outputs sSecond from the second capacitance column to a second analog integrator; and
the step (B) carries out (I) the first inner product operation by subjecting the outputs sFirst, which have been outputted to the first analog integrator, to an AD conversion in an AD converter and (II) the second inner product operation by subjecting the outputs sSecond, which have been outputted to the second analog integrator, to an AD conversion in the AD converter.

8. The capacitance detecting method according to claim 5, wherein:
   the step (A) first outputs the outputs sFirst from the first capacitance column to an analog integrator and second outputs the outputs sSecond from the second capacitance column to the analog integrator; and
   the step (B) carries out (I) the first inner product operation by subjecting the outputs sFirst, which have been outputted to the analog integrator, to an AD conversion in an AD converter and (II) the second inner product operation by subjecting the outputs sSecond, which have been outputted to the analog integrator, to an AD conversion in the AD converter.

9. The capacitance detecting method according to claim 5, wherein:
   the step (A) outputs the outputs sFirst from the first capacitance column to a first analog integrator and the outputs sSecond from the second capacitance column to a second analog integrator; and
   the step (B) carries out (I) the first inner product operation by subjecting the outputs sFirst, which have been outputted to the first analog integrator, to an AD conversion in a first AD converter and (II) the second inner product operation by subjecting the outputs sSecond, which have been outputted to the second analog integrator, to an AD conversion in a second AD converter.

10. An integrated circuit, comprising:
    a drive section for (a) driving, on a basis of code sequences di (=di1, di2, . . . , diN, where i =1, . . . , M, and where M<N) each of which has a length N, M drive lines in parallel for each of (I) a first capacitance column C1i (i=1, . . . , M) formed between the M drive lines and a first sense line and (II) a second capacitance column C2i (i=1, . . . , M) formed between the M drive lines and a second sense line, and thus (b) outputting outputs sFirst=(s11, s12, . . . , s1N) from the first capacitance column and outputs sSecond=(s21, s22, . . . , s2N) from the second capacitance column; and
    an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line.

11. A touch sensor system, comprising:
    a sensor panel including (I) a first capacitance column C1i (i=1, . . . , M) formed between M drive lines and a first sense line and (II) a second capacitance column C2i (i=1, . . . , M) formed between the M drive lines and a second sense line; and
    an integrated circuit for controlling the sensor panel,
    the integrated circuit including:
      a drive section for (a) driving, on a basis of code sequences di (=di1, di2, . . . , diN, where i=1, . . . , M, and where M<N) each of which has a length N, the M drive lines in parallel for each of (I) the first capacitance column C1i (i=1, . . . , M) and (II) the second capacitance column C2i (i=1, . . . , M) and thus (b) outputting outputs sFirst=(s11, s12, . . . , s1N) from the first capacitance column and outputs sSecond=(s21, s22, . . . , s2N) from the second capacitance column; and
      an estimation section for estimating (a) on a basis of a first inner product operation of the outputs sFirst and the code sequences di, a first capacitance value in the first capacitance column which first capacitance value corresponds to a k1-th drive line and (b) on a basis of a second inner product operation of the outputs sSecond and the code sequences di, a second capacitance value in the second capacitance column which second capacitance value corresponds to a k2-th drive line.

12. An electronic device, comprising:
    the touch sensor system recited in claim 11; and
    a display panel which either is placed on the sensor panel included in the touch sensor system or contains the sensor panel.

* * * * *